US007265583B2

(12) United States Patent
Hirano

(10) Patent No.: US 7,265,583 B2
(45) Date of Patent: Sep. 4, 2007

(54) VOLTAGE LEVEL CONVERSION CIRCUIT

(75) Inventor: Hiroshige Hirano, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 167 days.

(21) Appl. No.: 11/175,450

(22) Filed: Jul. 7, 2005

(65) Prior Publication Data
US 2006/0145723 A1    Jul. 6, 2006

(30) Foreign Application Priority Data
Jul. 8, 2004    (JP)    ............................. 2004-202105

(51) Int. Cl.
*H03K 19/82* (2006.01)
(52) U.S. Cl. ............................. 326/78; 326/62; 326/63; 326/75
(58) Field of Classification Search .................. 326/68, 326/78, 81, 83; 327/108, 333
See application file for complete search history.

(56) References Cited
U.S. PATENT DOCUMENTS

| 5,650,742 A | 7/1997 | Hirano | 327/333 |
| 6,717,453 B2* | 4/2004 | Aoki | 327/333 |
| 6,853,234 B2* | 2/2005 | Bucossi | 327/333 |

FOREIGN PATENT DOCUMENTS

JP    7-321638    12/1995

* cited by examiner

*Primary Examiner*—Shuwang Liu
*Assistant Examiner*—Crystal L Hammond
(74) *Attorney, Agent, or Firm*—Wenderoth, Lind & Ponack, L.L.P.

(57) ABSTRACT

A voltage level conversion circuit for converting a voltage level of a low voltage system input signal into a voltage level of a high voltage system signal comprises a latch circuit comprising plural high-breakdown-voltage MOS transistors having a high power supply voltage as a breakdown voltage, a first high-breakdown-voltage N channel MOS transistor which discharges one of the latch nodes of the latch circuit, and a second high-breakdown-voltage N channel MOS transistor which discharges the other latch node, and a pulse signal obtained by boosting a low voltage system pulse signal is applied to a gate of the first or second high-breakdown voltage N channel MOS transistor when the input signal transits.

13 Claims, 13 Drawing Sheets

VOLTAGE LEVEL CONVERSION CIRCUIT

FIELD OF THE INVENTION

The present invention relates to a voltage level conversion circuit and, more particularly, to a circuit for converting an input signal having a logical voltage level corresponding to a first power supply voltage into an output signal having a logical voltage level corresponding to a second power supply voltage that is higher than the first power supply voltage.

BACKGROUND OF THE INVENTION

In recent years, with miniaturization of semiconductor processes, two kinds of voltages, i.e., an external voltage and an internal voltage, are employed in semiconductor devices, and the internal voltage is set lower than the external voltage. Therefore, there is a necessity for a circuit for converting the logical voltage level of a signal between a circuit driven by the external voltage and a circuit driven by the internal voltage.

Hereinafter, a description will be given of a prior art relating to a circuit for converting a logical voltage corresponding to a low power supply voltage to a logical voltage corresponding to a high power supply voltage (hereinafter referred to as "voltage level conversion circuit").

As an example of a conventional circuit of this kind, Japanese Published Patent Application No. Hei. 7-321638 (pages 10-11 and 15-16, FIGS. 1-3 and 12-13) discloses a voltage level conversion circuit which is driven by a high power supply voltage.

FIG. 13 is a diagram for explaining the voltage level conversion circuit disclosed in this gazette.

This voltage level conversion circuit 101 includes a first N channel MOS transistor Qn101 which is connected between a first input node Iin and an internal node N101, a first P channel MOS transistor Qp101 which is connected between a high power supply voltage VPP and the internal node N101, and a power supply side second P channel MOS transistor Qp102 and a ground side second N channel MOS transistor Qn102 which are connected in series between the high power supply voltage VPP and a ground voltage VSS.

A first input signal I1 having a logical voltage corresponding to a low power supply voltage VCC is applied to the first input node Iin, and a second input signal S1 having a logical voltage higher than that of the first input signal I1, which is generated on the basis of the first input signal I1, is applied to a second input node Sin. Further, a gate of the first N channel MOS transistor Qn101 is connected to the second input node Sin, and a gate of the first P channel MOS transistor Pn101 is connected to an output node Nout which is a connection point of the second P channel MOS transistor Qp102 and the second N channel MOS transistor Qn102. A gate of the second P channel MOS transistor Qp102 is connected to the internal node N101, and a gate of the second N channel MOS transistor Qn102 is connected to the first input node Iin. A latch circuit for latching the input signal I1 applied to the first input node Iin to output an inversion signal O1 thereof from an output node Nout is constituted by the first and second P channel MOS transistors Qp101 and Qp102.

Next, the operation will be described.

When the first and second input signals I1 and S1 are applied to the first and second input nodes Iin and Sin of the voltage level conversion circuit 101, respectively, the internal node N101 of the voltage level conversion circuit 101 comes to have a voltage level according to the logical level of the first input signal I1.

To be specific, when the logical level of the first input signal I1 is L level, the internal node N101 of the voltage level conversion circuit 101 comes to have L level. At this time, in the voltage level conversion circuit 101, the N channel MOS transistor Qn102 is turned off and the P channel MOS transistor Qp102 is turned on, and an H-level output signal O1 is output from the output node NOUT. Further, at this time, the P channel MOS transistor Qp101 is completely turned off.

In this state, when the logical level of the first input signal I1 transits from L level to H level, the N channel MOS transistor Qn102 is completely turned on. At this time, since the voltage level of the second input signal S1 applied to the gate of the N channel MOS transistor Qn101 is boosted to a voltage level that is higher than the H level voltage VCC of the first input signal I1, the voltage at the node N101 of the voltage level conversion circuit 101 becomes not a voltage that is lower than the power supply voltage (VCC) by the threshold voltage Vth of the transistor (VCC-Vth) but the power supply voltage (VCC), and the P channel MOS transistor Qp102 is approximately turned off.

When the output signal O1 becomes L level, the P channel MOS transistor Qp101 is completely turned on, and the voltage at the node N101 becomes the second power supply voltage VPP, whereby the P channel MOS transistor Qp102 is completely turned off.

In the conventional voltage level conversion circuit 101 as described above, since the N channel MOS transistors are high-breakdown-voltage transistors each having a breakdown voltage corresponding to the high power supply voltage VPP, the threshold values thereof are usually high. Therefore, when the logical voltage of the input signal is lowered, the on-state of the N channel MOS transistor Qn102 becomes imperfect, and it takes time to fix the voltage level of the output signal at L level.

As a countermeasure against the problem that occurs when making the voltage level conversion circuit perform low-voltage operation, the above-mentioned gazette proposes as follows. That is, in the voltage level conversion circuit 101 shown in FIG. 13 wherein the gate voltage of the N channel MOS transistor Qn101 is the power supply voltage VCC, a P channel MOS transistor with a gate being connected to the input node Iin is inserted between the power supply voltage VPP and the P channel MOS transistor Qp102 and, when the input signal changes from H level to L level, the current that flows from the power supply voltage VPP into the output terminal Nout is promptly cutoff.

In this circuit construction, when the input signal changes from H level to L level, the voltage level of the output signal O1 can be quickly fixed to L level. However, it is impossible to solve the essential problem in the low voltage operation of the voltage level conversion circuit, that is, it is still difficult to operate the VPP power supply system N channel MOS transistor having the high power supply voltage VPP as a breakdown voltage, at a voltage lower than the threshold voltage.

As described above, since the conventional voltage level conversion circuit shown in FIG. 13 controls the high-breakdown-voltage transistor having, as a power supply voltage, the external voltage that is a high voltage, with a signal corresponding to the internal voltage that is a low voltage, it is difficult to operate the high-breakdown-voltage transistor when the threshold value of the high-breakdown-voltage transistor is high and the internal voltage is lower than the threshold value. Therefore, such voltage level conversion circuit becomes a disincentive to low power consumption and miniaturization of transistors due to low voltage operation in semiconductor devices.

SUMMARY OF THE INVENTION

The present invention is made to solve the above-mentioned problems and has for its object to provide a voltage level conversion circuit which can convert a logical voltage of an input signal from a logical voltage corresponding to a lower internal voltage to a logical voltage corresponding to an external voltage as a high power supply voltage, thereby to realize a low voltage operation of a semiconductor device using the lower internal voltage.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, there is provided a voltage level conversion circuit for converting an input signal having a logical voltage corresponding to a first power supply voltage into an output signal having a logical voltage corresponding to a second power supply voltage that is higher than the first power supply voltage, and outputting the output signal, and the voltage level conversion circuit comprises: a latch circuit comprising plural MOS transistors each having the second power supply voltage as a breakdown voltage, and operable to latch a non-inversion logic corresponding to the input signal at a first latch node while latching an inversion logic reverse to the input signal at a second latch node; a first N channel MOS transistor having the second power supply voltage as a breakdown voltage, which is connected between the first latch node and a ground voltage supply; a second N channel MOS transistor having the second power supply voltage as a breakdown voltage, which is connected between the second latch node and the ground voltage supply; and a transistor driving circuit supplied with the first power supply voltage as a power supply voltage, and operable to apply, when the input signal transits, a pulse signal having a pulse height that is boosted to a level higher than the first power supply voltage, to a gate of the first N channel MOS transistor or to a gate of the second N channel MOS transistor. In other words, according to the first aspect, there is provided a circuit for converting the logical level of an input signal from a voltage level corresponding to the low power supply voltage to a voltage level corresponding to the high power supply voltage, and the circuit is provided with a latch circuit comprising plural high-breakdown-voltage MOS transistors each having the high power supply voltage as a breakdown voltage; a first high-breakdown-voltage N channel MOS transistor which discharges one of the latch nodes of the latch circuit; and a second high-breakdown-voltage N channel MOS transistor which discharges the other latch node of the latch circuit; and a pulse signal having a pulse height that is boosted to a level higher than the first power supply voltage is applied to the gate of the first N channel MOS transistor or to the gate of the second N channel MOS transistor when the input signal transits. Therefore, the logical voltage of the input signal can be converted from a logical voltage corresponding to a lower internal voltage to a logical voltage corresponding to an external voltage that is a high voltage, resulting in a voltage level conversion circuit which enables a low voltage operation of a semiconductor device by the lower internal voltage.

According to a second aspect of the present invention, in the voltage level conversion circuit according to the first aspect, a third N channel MOS transistor having the first power supply voltage as a breakdown voltage is connected in series to the first N channel MOS transistor, between the first latch node and the ground voltage supply; and a fourth N channel MOS transistor having the first power supply voltage as a breakdown voltage is connected in series to the second N channel MOS transistor, between the second latch node and the ground voltage supply. In other words, a third low-breakdown-voltage N channel MOS transistor is connected in series to the first high-breakdown-voltage N channel MOS transistor between the one latch node and the ground voltage supply, and a fourth low-breakdown-voltage N channel MOS transistor is connected in series to the second high-breakdown-voltage N channel MOS transistor between the other latch node and the ground voltage supply. Therefore, in the state where a H level voltage is held at the latch nodes, leakage current from the latch nodes to the ground side can be prevented by the low-breakdown-voltage N channel MOS transistors in their off states.

According to a third aspect of the present invention, in the voltage level conversion circuit according to the second aspect, when the input signal transits, the transistor driving circuit drives both of the first and third N channel MOS transistors or both of the second and fourth N channel MOS transistors using the pulse signal. Therefore, the transistors which discharge the respective latch nodes are in their on states only during a pulse period of a pulse signal that is generated according to the transition of the input signal and, after the transition of the input signal, the H level logical voltage held at the latch nodes can be maintained with stability.

According to a fourth aspect of the present invention, in the voltage level conversion circuit according to the third aspect, the transistor driving circuit maintains the off states of the first to fourth N channel MOS transistor so that the output signal is not reset to the logic corresponding to the input signal, when the voltage level conversion circuit is powered on. Since the transistor driving circuit does not reset the output signal to the logic corresponding to the input signal when the voltage level conversion circuit is powered on, the circuit construction of the transistor driving circuit can be simplified as compared with a transistor driving circuit that performs reset of an output signal at power-on.

According to a fifth aspect of the present invention, in the voltage level conversion circuit according to the third aspect, the transistor driving circuit drives the first to fourth N channel MOS transistors so that the output signal is reset to the logic corresponding to the input signal, when the voltage level conversion circuit is powered on. Since the transistor driving circuit resets the output signal to the logic corresponding to the input signal when the voltage level conversion circuit is powered on, the logical level of the output signal of the voltage level conversion circuit can be matched to the logical level of the input signal of the voltage level conversion circuit at power-on. Therefore, the voltage level conversion circuit can also be used as a circuit for converting the voltage level of a DC-like signal from a low voltage level to a high voltage level.

According to a sixth aspect of the present invention, in the voltage level conversion circuit according to the second aspect, when the input signal transits, the transistor driving circuit applies a pulse signal whose pulse height is boosted to a level higher than the first power supply voltage, to the gate of the first N channel MOS transistor or to the gate of the second N channel MOS transistor, and applies a logical signal according to the input signal or the inversion signal of the input signal to the gate of the third N channel MOS transistor or to the gate of the fourth N channel MOS transistor. Since, when the input signal transits, the transistor driving circuit applies the pulse signal whose pulse height is boosted to a level higher than the first power supply voltage to the gate of the first or second high-breakdown-voltage N channel MOS transistors, and applies the logical signal corresponding to the input signal to the gates of the third and fourth low-breakdown-voltage N channel MOS transistors, the circuit construction of the transistor driving circuit can be simplified as compared with a transistor driving circuit which applies a pulse signal to the gates of the third and fourth low-breakdown-voltage N channel MOS transistors.

According to a seventh aspect of the present invention, in the voltage level conversion circuit according to the sixth aspect the transistor driving circuit maintains the off states of the first to fourth N channel MOS transistors so that the output signal is not reset to the logic corresponding to the input signal, when the voltage level conversion circuit is powered on. Since the transistor driving circuit does not reset the output signal to the logic corresponding to the input signal when the voltage level conversion circuit is powered on, the circuit construction of the transistor driving circuit can be simplified as compared with a transistor driving circuit that performs reset of an output signal at power-on.

According to an eighth aspect of the present invention, in the voltage level conversion circuit according to the sixth aspect, the transistor driving circuit drives the first to fourth N channel MOS transistors so that the output signal is reset to the logic corresponding to the input signal, when the voltage level conversion circuit is powered on. Since the transistor driving circuit resets the output signal to the logic corresponding to the input signal when the voltage level conversion circuit is powered on, the logical level of the output signal of the voltage level conversion circuit can be matched to the logical level of the input signal of the voltage level conversion circuit at power-on. Therefore, the voltage level conversion circuit can also be used as a circuit for converting the voltage level of a DC-like signal from a low voltage level to a high voltage level.

According to a ninth aspect of the present invention, in the voltage level conversion circuit according to the first aspect, when the input signal transits, a pulse signal whose pulse height varies from the ground voltage to a boosted voltage higher than the first power supply voltage is applied to the gate of the first N channel MOS transistor or the second N channel MOS transistor. Therefore, perfect on-state and off-state of the high-breakdown-voltage transistor which discharges the latch node can be realized by the pulse signal applied to the gate of the transistor. Accordingly, the logical voltage of the input signal can be converted from the logical voltage corresponding to the lower internal voltage to the logical voltage corresponding to the external voltage as a high voltage, and furthermore, the circuit construction for drive-controlling the transistors of the latch circuit that is driven by the high power supply voltage can be simplified.

According to a tenth aspect of the present invention, in the voltage level conversion circuit according to the ninth aspect, the transistor driving circuit maintains the off states of the first and second N channel MOS transistors so that the output signal is not reset to the logic corresponding to the input signal, when the voltage level conversion circuit is powered on. Since the transistor driving circuit does not reset the output signal to the logic corresponding to the input signal when the voltage level conversion circuit is powered on, the circuit construction of the transistor driving circuit can be simplified as compared with a transistor driving circuit that performs reset of an output signal at power-on.

According to an eleventh aspect of the present invention, in the voltage level conversion circuit according to the ninth aspect, the transistor driving circuit drives the first and second N channel MOS transistors so that the output signal is reset to the logic corresponding to the input signal, when the voltage level conversion circuit is powered on. Since the transistor driving circuit resets the output signal to the logic corresponding to the input signal when the voltage level conversion circuit is powered on, the logical level of the output signal of the voltage level conversion circuit can be matched to the logical level of the input signal of the voltage level conversion circuit at power-on. Therefore, the voltage level conversion circuit can also be used as a circuit for converting the voltage level of a DC-like signal from a low voltage level to a high voltage level.

According to a twelfth aspect of the present invention, in the voltage level conversion circuit according to the first aspect, the latch circuit comprises a first series circuit comprising a P channel MOS transistor having the second power supply voltage as a breakdown voltage and an N channel MOS transistor having the second power supply voltage as a breakdown voltage, which are connected in series between the second power supply and the ground voltage supply, and a second series circuit comprising a P channel MOS transistor having the second power supply voltage as a breakdown voltage and an N channel MOS transistor having the second power supply voltage as a breakdown voltage, which are connected in series between the second power supply and the ground voltage supply; a connection point of the power supply side P channel MOS transistor and the ground side N channel MOS transistor in the first series circuit is connected to gates of the P channel MOS transistor and the N channel MOS transistor in the second series circuit to be the first latch node; and a connection point of the power supply side P channel MOS transistor and the ground side N channel MOS transistor in the second series circuit is connected to gates of the P channel MOS transistor and the N channel MOS transistor in the first series circuit to be the second latch node. Since the latch circuit is constituted by the transistors which charge the respective latch nodes and the transistors which discharge the respective latch nodes, the voltages at the latch nodes can be quickly set to the logic corresponding to the input signal.

According to a thirteenth aspect of the present invention, in the voltage level conversion circuit according to the first aspect, the latch circuit comprises a first series circuit comprising two P channel MOS transistors having the second power supply voltage as a breakdown voltage, which are connected in series between the second power supply and the first latch node, and an N channel MOS transistor having the second power supply voltage as a breakdown voltage, which is connected between the first latch node and the ground voltage supply, and a second series circuit comprising two P channel MOS transistors having the second power supply voltage as a breakdown voltage, which are connected in series between the second power supply and the second latch node, and an N channel MOS transistor having the second power supply voltage as a breakdown voltage, which is connected between the second latch node and the ground voltage supply; a gate of the power supply side P channel MOS transistor in the first series circuit and a gate of the N channel MOS transistor in the first series circuit are connected to the second latch node; a gate of the power supply side P channel MOS transistor in the second series circuit and a gate of the N channel MOS transistor in the second series circuit are connected to the first latch node; and a pulse signal which is generated in the transistor driving circuit when the input signal transits is applied to gates of the latch node side P channel MOS transistors in the first and second series circuits. Since the latch circuit includes the P channel MOS transistors which prevent charges from being supplied from the high power supply voltage to the first and second latch nodes when the latch nodes are discharged, the voltages at the latch nodes quickly transit from H level to L level when the input signal transits, resulting in a voltage level conversion circuit capable of a higher speed operation.

According to a fourteenth aspect of the present invention, in the voltage level conversion circuit according to the first aspect, the latch circuit comprises a first P channel MOS transistor having the second power supply voltage as a breakdown voltage, which is connected between the second power supply and the first latch node, and a second P channel MOS transistor having the second power supply voltage as a breakdown voltage, which is connected between the second power supply and the second latch node; and a gate of the first P channel MOS transistor is the second latch node, and a gate of the second P channel MOS transistor is the first latch node. Since the latch circuit is constituted by only the transistors which charge the respective latch nodes, the construction of the latch circuit is simplified.

DETAILED DESCRIPTION OF THE PREFERRED EMBODIMENTS

A voltage level conversion circuit according to the present invention is a circuit for converting an input signal having a logical voltage of a low voltage circuit system (VDD1 system) that is supplied with a low power supply voltage as a power supply voltage into an output signal having a logical voltage of a high voltage circuit system (VDD2 system) that is supplied with a high power supply voltage as a power supply voltage, and the circuit has a fundamental construction including a VDD2 system latch circuit, a high-breakdown-voltage VDD2 system N channel MOS transistor which is inserted between a latch node of the latch circuit and a ground voltage, and a pulse generation circuit for detecting transition of the logical level of the input signal and generating a pulse signal having the logical voltage of the VDD1 system, wherein the voltage level of the pulse signal is boosted to be applied to a gate of the N channel MOS transistor. Therefore, the voltage level conversion circuit is operated even when the low power supply voltage is lower than the threshold value of the high-breakdown-voltage VDD2 system transistor.

Hereinafter, embodiments of the present invention will be described.

Embodiment 1

A first embodiment of the present invention relates to a voltage level conversion circuit including a latch circuit that is supplied with a high power supply voltage as a power supply voltage, and has a fundamental circuit construction in which a VDD2 system N channel MOS transistor and a VDD1 system N channel MOS transistor are connected in series between a latch node of the latch circuit and a ground voltage supply, a pulse signal having a logical voltage of the VDD1 system is applied to the gate of the VDD1 system N channel MOS transistor when an input signal transits, and the pulse signal with the VDD1 system logical voltage being boosted is applied to the gate of the VDD2 system N channel MOS transistor. In this first embodiment, the VDD2 system MOS transistor has a high power supply voltage as a breakdown voltage, and the VDD1 system MOS transistor has a low power supply voltage as a breakdown voltage.

Figure 1:
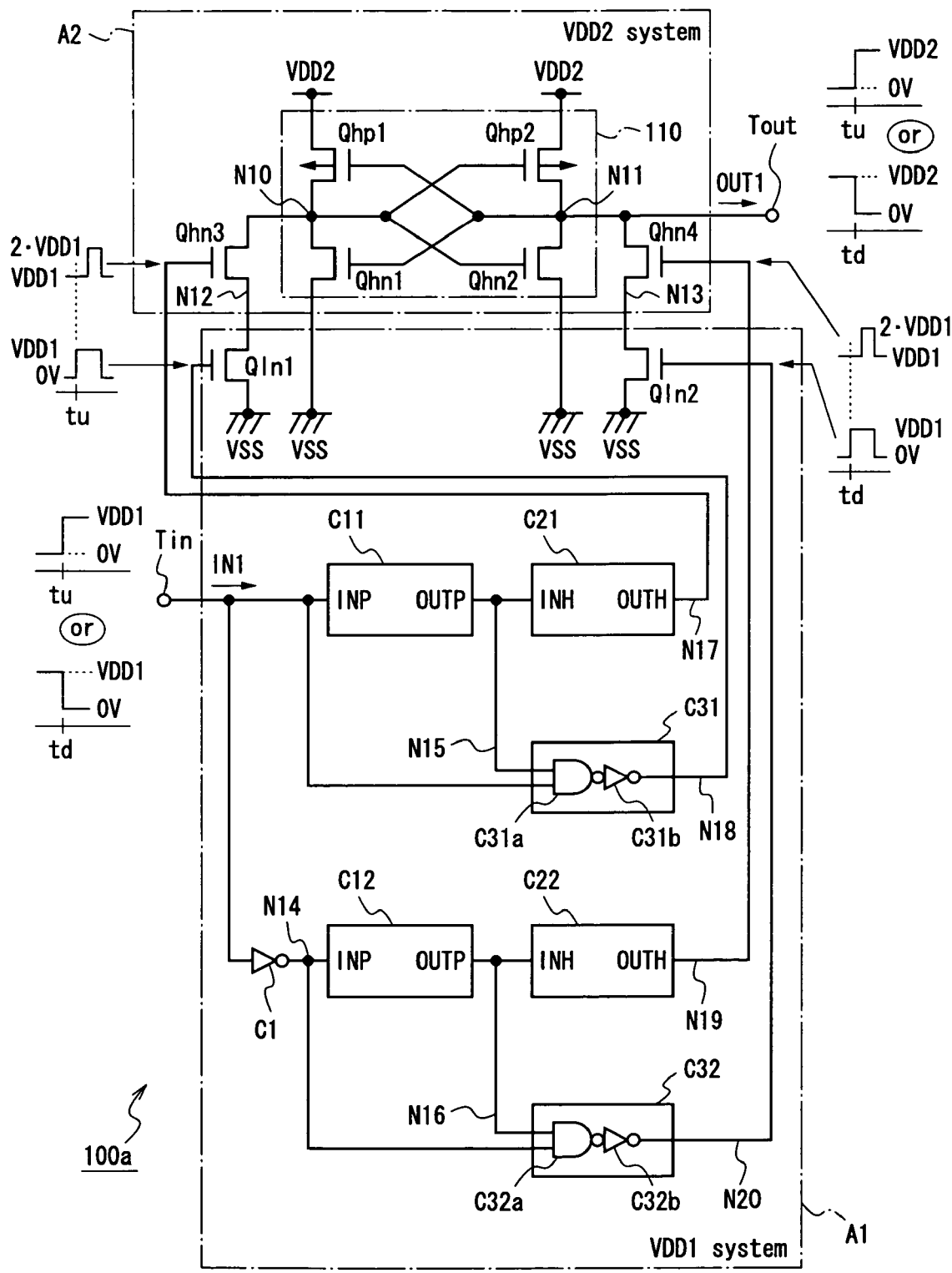
FIG. 1 is a diagram for explaining a voltage level conversion circuit 100a according to a first embodiment of the present invention.

FIG. 1 is a circuit diagram illustrating the whole construction of a voltage level conversion circuit 100a according to the first embodiment.

The voltage level conversion circuit 100a is a circuit for converting an input signal IN1 having a logical voltage corresponding to a low power supply voltage VDD1 into an output signal OUT1 having a logical voltage corresponding to a high power supply voltage VDD2, and outputting the output signal OUT1. Hereinafter, the specific circuit construction will be described in detail.

The voltage level conversion circuit 100a includes a first series circuit in which a first VDD2 system P channel MOS transistor Qhp1 and a first VDD2 system N channel MOS transistor Qhn1 are connected in series between the high power supply voltage VDD2 and the ground voltage VSS, and a second series circuit in which a second VDD2 system P channel MOS transistor Qhp2 and a second VDD2 system N channel MOS transistor Qhn2 are connected in series between the high power supply voltage VDD2 and the ground voltage VSS.

A connection node N10 of the power supply side P channel MOS transistor Qhp1 and the ground side N channel MOS transistor Qhn1 in the first series circuit is connected to a gate of the power supply side P channel MOS transistor Qhp2 and a gate of the ground side N channel MOS transistor Qhn2 in the second series circuit. A connection node N11 of the power supply side P channel MOS transistor Qhp2 and the ground side N channel MOS transistor Qhn2 in the second series circuit is connected to a gate of the power supply side P channel MOS transistor Qhp1 and a gate of the ground side N channel MOS transistor Qhn1 in the first series circuit. A latch circuit 110 comprises the MOS transistors constituting the first and second series circuits, and the connection nodes N10 and N11, which are a pair of latch nodes of the latch circuit 110.

The voltage level conversion circuit 100a further includes a third series circuit which is obtained by connecting a third VDD2 system N channel MOS transistor Qhn3 and a first VDD1 system N channel MOS transistor Qln1 in series between the connection node N10 and the ground voltage VSS, and discharges the connection node N10, and a fourth series circuit which is obtained by connecting a fourth VDD2 system N channel MOS transistor Qhn4 and a second VDD1 system N channel MOS transistor Qln2 in series between the connection node N11 and the ground voltage VSS, and discharges the connection node N11.

The first and second VDD2 system P channel MOS transistors Qhp1 and Qhp2 and the first to fourth VDD2 system N channel MOS transistors Qhn1 to Qhn4 are high-breakdown-voltage transistors having high threshold values, and these transistors belong to a circuit system (VDD2 system) A2 driven by the high power supply voltage VDD2. Further, the first and second VDD1 system N channel MOS transistors Qln1 and Qln2 are low-break-down-voltage transistors having low threshold values, and these transistors belong to a circuit system (VDD1 system) A1 driven by the low power supply voltage VDD1.

The voltage level conversion circuit 100a includes a first pulse signal generation circuit C11 for generating a pulse signal when the logical level of the input signal IN1 transits; a first boost voltage generation circuit C21 for boosting the logical voltage of the pulse signal outputted from the first pulse-signal generation circuit C11, and applying the pulse signal with the boosted logical voltage to the gate of the latch node side MOS transistor Qhn3 of the third series circuit; and a first logical circuit C31 for shaping the waveform of the pulse signal outputted from the first pulse signal generation circuit C11, and applying the pulse signal to the gate of the ground side N channel MOS transistor Qln1 of the third series circuit. Further, the voltage level conversion circuit 100a includes a NOT circuit C1 which receives the input signal IN1 and outputs an inversion signal of the input signal; a second pulse signal generation circuit C12 for generating a pulse signal when the logical level of the inversion signal transits; a second boost voltage generation circuit C22 for boosting the logical voltage of the pulse signal outputted from the second pulse signal generation circuit C12, and applying the pulse signal with the boosted logical voltage to the gate of the latch node side MOS transistor Qhn4 of the fourth series circuit; and a second logical circuit C32 for shaping the waveform of the pulse signal outputted from the second pulse signal generation circuit C12, and applying the pulse signal to the gate of the ground side N channel MOS transistor Qln2 of the fourth series circuit.

A transistor driving circuit for driving the N channel MOS transistors in the third and fourth series circuits is constituted by the NOT circuit C1, the first and second pulse signal generation circuits C11 and C12, the first and second boost circuits C21 and C22, and the first and second logical circuits C31 and C32, and this transistor driving circuit is supplied with the low power supply voltage VDD1 as a power supply voltage.

Hereinafter, the pulse signal generation circuits and the boost voltage generation circuits in the transistor driving circuit will be described specifically.

Figure 2:
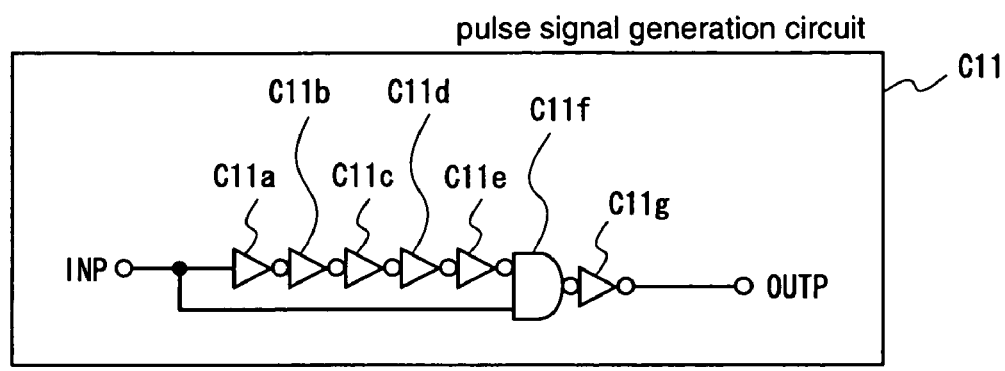
FIG. 2(a) is a diagram for explaining a pulse signal generation circuit C11 included in the voltage level conversion circuit 100a according to the first embodiment.
FIG. 2(b) is a diagram for explaining a boost voltage generation circuit C21 included in the voltage level conversion circuit 100a according to the first embodiment.
Figure 2:
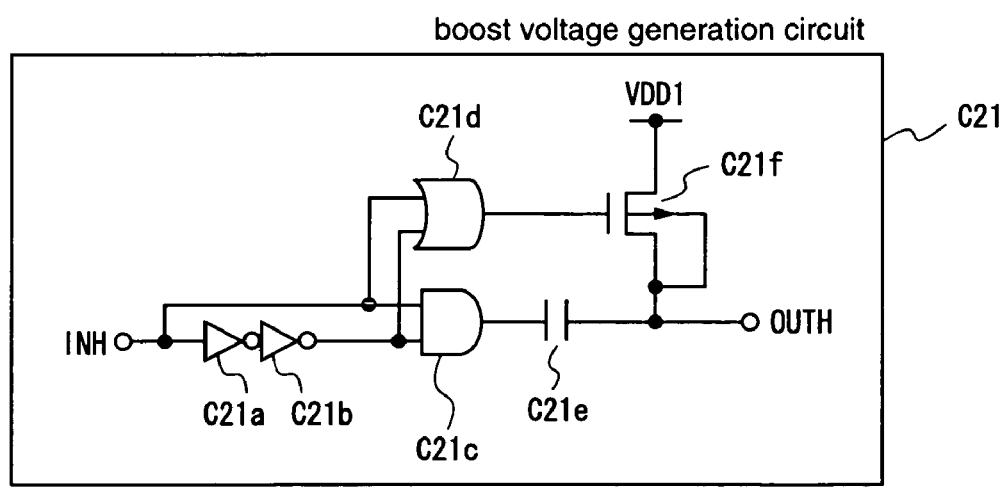

FIG. 2(a) shows a specific circuit construction of the first pulse signal generation circuit C11.

The first pulse signal generation circuit C11 generates a pulse signal having a pulse width equivalent to a signal delay time caused by five stages of NOT circuits, when the logical level of the input signal IN1 changes from L level to H level, and the first pulse signal generation circuit C11 comprises five stages of NOT circuits C11a~C11e which are successively connected to an input node INP to which the input signal IN1 is applied, a NAND circuit C11f for performing a logical operation between the output of the final-stage NOT circuit C11e and the input signal IN1, and a NOT circuit C11g for inverting the output of the NAND circuit C11f and outputting the inversion signal to an output node OUTP.

Further, the second pulse signal generation circuit C12 generates a pulse signal having a pulse width equivalent to a signal delay time caused by five-stages of NOT circuits, when the logical level of the input signal IN1 changes from H level to L level and thereby the logical level of the output signal of the NOT circuit C1 which receives the input signal IN1 changes from L level to H level, and the second pulse signal generation circuit C12 has the same circuit construction as that of the first pulse signal generation circuit C11.

FIG. 2(b) shows the specific circuit construction of the first boost voltage generation circuit C21.

The first boost voltage generation circuit C21 boosts the pulse signal outputted from the first pulse signal generation circuit C11, and outputs the boosted pulse signal. The first boost voltage generation circuit C21 includes a first NOT circuit C21a for inverting a signal applied to an input node INH, a second NOT circuit C21b for inverting the output of the first NOT circuit, a two-input AND circuit C21c for calculating an AND of the signal applied to the input node INH and the output of the second NOT circuit C21b, and a capacitor C21e which is connected between the output end of the two-input AND circuit C21c and an output node OUTH. Further, the first boost voltage generation circuit C21 includes a VDD1 system P channel MOS transistor C21f which is connected between the low power supply voltage VDD1 and the output node OUTH, and an OR circuit C21d for calculating an OR of the input signal applied to the input node INH and the output signal of the second NOT circuit C21b, and applying the OR signal to the gate of the P channel MOS transistor C21f.

Further, the second boost voltage generation circuit C22 boosts the pulse signal outputted from the second pulse signal generation circuit C12 to output the boosted pulse signal, and has the same circuit construction as that of the first boost voltage generation circuit C21.

The first logical circuit C31 comprises a NAND circuit C31a which receives the input signal IN1 applied to the input node Tin and the output signal of the first pulse signal generation circuit C11, and a NOT circuit C31b for inverting the output signal of the NAND circuit 31a, and the first logical circuit C31 shapes the waveform of the pulse signal generated by the first pulse signal generation circuit C11, and applies the waveform-shaped pulse signal to the gate of the first VDD1 system N channel MOS transistor Qln1. The second logical circuit C32 comprises a NAND circuit C32a which receives the output signal of the NOT circuit C1 which receives the input signal IN1 and the output signal of the second pulse signal generation circuit C12, and a NOT circuit C32b for inverting the output signal of the NAND circuit C32a, and the second logical circuit C32 shapes the waveform of the pulse signal generated by the second pulse signal generation circuit C12, and applies the waveform-shaped pulse signal to the gate of the second VDD1 system N channel MOS transistor Qln2.

Although the specific circuit construction of the NOT circuit C1 is not illustrated, the NOT circuit C1 comprises a P channel MOS transistor and an N channel MOS transistor which are connected in series between the low power supply voltage VDD1 and the ground voltage VSS, and the gates of these transistors are commonly connected.

Next, the operation will be described.

Figure 3:
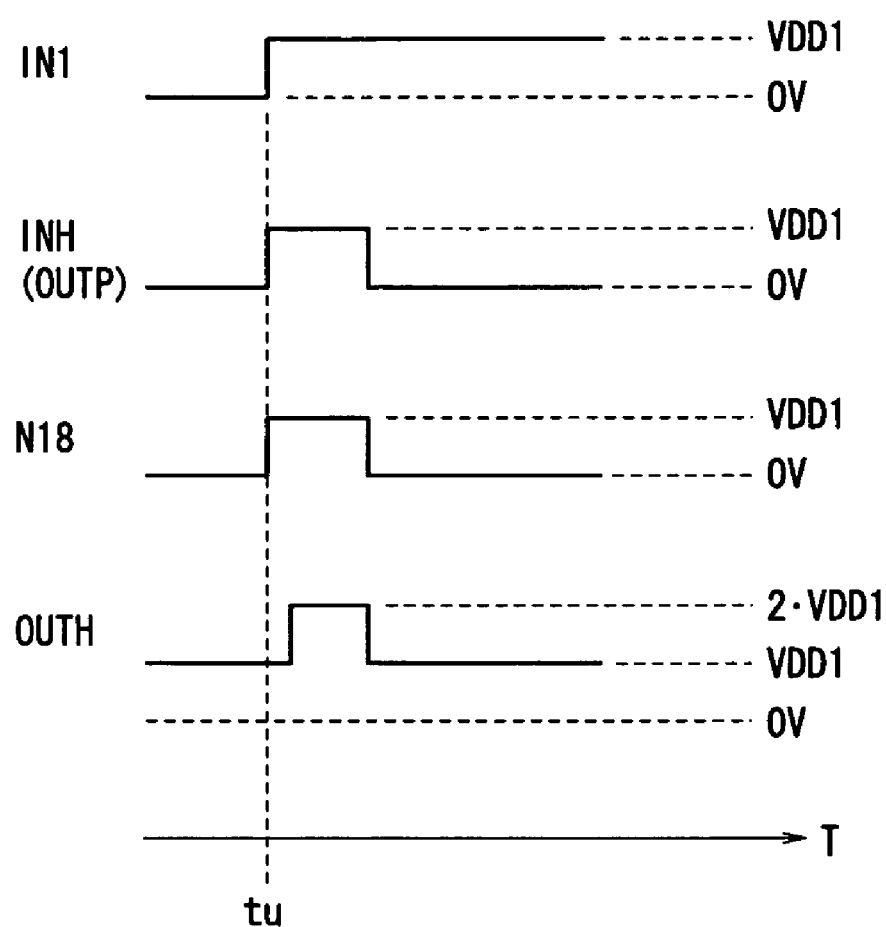
FIG. 3 is a signal waveform diagram for explaining the operations of pulse signal generation circuit C11 (C21) and the boost voltage generation circuit C21 (C22) according to the first embodiment.

FIG. 3 is a waveform diagram for explaining the operation of the voltage level conversion circuit 100a according to the first embodiment.

In the voltage level conversion circuit 100a, the VDD1 system input signal IN1 applied to the input terminal Tin is converted into the VDD2 system output signal OUT1 to be outputted from the output terminal Tout.

For example, when the logical level of the VDD1 system input signal IN1 transits from L level to H level, the first pulse signal generation circuit C11 detects the transition of the logical level of the input signal IN1, and generates a VDD1 system one-shot pulse signal synchronized with the rise timing tu of the input signal IN1.

To be specific, in the first pulse signal generation circuit C11, when the input signal IN1 transits from L level to H level, one input voltage of the NAND circuit C11f changes from L level to H level simultaneously with the transition timing of the input signal, while the other input voltage changes from H level to L level after a delay time equivalent to the five stages of NOT circuits C11a~C11e from the transition timing of the input signal IN1. Therefore, during a period in which the both input voltages of the NAND circuit C11f are H level, the output voltage of the NAND circuit C11f is L level, and a pulse signal which rises in synchronization with the transition of the input signal IN1 is outputted from the subsequent NOT circuit C11g. When the level of the input signal changes from H level to L level, there is no period in which the both input voltages of the NAND circuit C11f are H level, and the output voltage of the NOT circuit C11g remains at L level. When the input signal IN1 transits from L level to H level, since the logical level of the output signal of the NOT circuit C1 changes from H level to L level, no transition of the input signal IN1 is detected in the second pulse signal generation circuit C1.

When the pulse signal outputted from the first pulse signal generation circuit C11 is input to the first boost voltage generation circuit C21, the first boost voltage generation circuit C21 generates a pulse signal which is obtained by boosting the VDD1 system one-shot pulse signal so that the pulse height voltage VDD1 thereof becomes twice as high as the VDD1 (2·VDD1), and applies the boosted pulse signal to the gate of the VDD2 system P channel MOS transistor Qhn3.

To be specific, in the first boost voltage generation circuit C21, when the logical level of the signal applied to the input node INH is L level, both of the output of the AND circuit C21c and the output of the OR circuit C21d are L level, and thereby the P channel MOS transistor C21f is turned on and the voltage at the output node OUTH becomes equal to the low power supply voltage VDD1. At this time, the capacitor C21e is charged so that the node on the output end OUTH side comes to have a voltage equal to the low power supply voltage VDD1.

Further, in the boost voltage generation circuit C21, when the pulse signal from the pulse signal generation circuit C11 is input to the input terminal INH and thereby the voltage level at the input terminal INH transits from L level to H level, one of the input voltages of the AND circuit C21c and the OR circuit C21d changes from L level to H level simultaneously with the voltage transition timing of the input terminal INH, while the other input voltage of these circuits C21c and C21d changes from L level to H level after a delay time equivalent to the two stages of NOT circuits C21a and C21b from the voltage transition timing of the input terminal INH. Therefore, after the output voltage of the OR circuit C21d transits from L level to H level, the output voltage of the AND circuit C21c transits from L level to H level. In other words, after the P channel MOS transistor C21f is turned off, the AND circuit side node of the capacitor C21e comes to have a voltage equal to the lower power supply voltage VDD1. Thereby, the output end side node of the capacitor C21e is boosted to a voltage about twice as high as the low power supply voltage VDD1. Further, when the output voltage of the AND circuit C21c transits from H level to L level at the fall timing (T=tu1) of the pulse signal inputted to the input terminal INH, the voltage of the output end side node of the capacitor C21e returns from the boosted voltage (2·VDD1) to the low power supply voltage VDD1.

When the pulse signal outputted from the pulse signal generation circuit C11 is input to the first logical circuit C31, the first logical circuit C31 shapes the waveform of the pulse signal, and applies the pulse signal to the gate of the VDD1 system N channel MOS transistor Qln1 which draws charges out of the latch node N10. That is, in the first logical circuit C31, when the input signal IN1 and the pulse signal outputted from the pulse signal generation circuit C11 are input to the NAND circuit C31a, the NAND circuit C31a outputs an inversion signal of an AND of the input signal and the pulse signal to the NOT circuit C31b. The NOT circuit C31b inverts the inversion signal, and outputs the AND signal of the input signal and the pulse signal to the gate of the N channel MOS transistor Qln1.

In this way, when the logical level of the VDD1 system input signal IN1 transits from L level to H level (T=tu), the pulse signal synchronized with the transition of the input signal IN1 is applied to the gate of the VDD1 system N channel MOS transistor Qln1 which discharges the one latch node N10, and simultaneously, the boosted VDD1 system pulse signal is applied to the gate of the VDD2 system N channel MOS transistor Qhn3 which is connected between the latch node N10 and the N channel MOS transistor Qln1. Thereby, the voltage at the latch node N10 becomes L level.

On the other hand, when the logical level of the VDD1 system input signal IN1 transits from H level to L level, the output signal of the NOT circuit C1 which receives the input signal IN1 transits from L level to H level. Therefore, the second pulse signal generation circuit C12 operates like the first pulse signal generation circuit C11 to detect the transition of the logical level of the input signal, and outputs a VDD1 system one-shot pulse signal synchronized with the fall timing (T=td) of the input signal IN1 to the second boost voltage generation circuit C22 and to the second logical circuit C32. At this time, in the first pulse signal generation circuit C11, since the input signal transits from H level to L level, no transition of the input signal IN1 is detected.

Then, the second boost voltage generation circuit C22 operates in the same manner as the first boost voltage generation circuit C21 to generate a pulse signal which is synchronized with the VDD1 system one-shot pulse signal and has a pulse height voltage VDD1 that is boosted to a voltage level twice as high as the VDD1 (2·VDD1), and applies this boosted pulse signal to the gate of the VDD2 system P channel MOS transistor Qhn4 which draws charges out of the latch node N11. Further, the second logical circuit C32 operates in the same manner as the first logical circuit C31 to shape the waveform of the VDD1 system pulse signal outputted from the second pulse signal generation circuit C12, and applies the waveform-shaped pulse signal to the gate of the VDD1 system N channel MOS transistor Qln2 which draws charges out of the latch node N11 and is connected in series to the VDD2 system N channel MOS transistor Qhn4.

Accordingly, when the logical level of the VDD1 system input signal IN1 transits from H level to L level (T=td), the pulse signal synchronized with the transition of the input signal IN1 is applied to the gate of the VDD1 system N channel MOS transistor Qln2 which discharges the other latch node N11, and simultaneously, the boosted VDD1 system pulse signal is applied to the gate of the VDD2 system N channel MOS transistor Qhn4 which is connected between the latch node N11 and the N channel MOS transistor Qln2. Thereby, the voltage at the latch node N11 becomes L level.

When the VDD1 system input signal N1 transits from L level to H level (T=tu), the latch node N10 of the latch circuit 110 becomes L level, and the P channel MOS transistor Qhp2 is turned on while the N channel MOS transistor Qhn2 is turned off. Thereby, the voltage of the latch node N11 becomes the high power supply voltage VDD2, and the output terminal OUT1 comes to have the VDD2 system H level voltage.

On the other hand, when the VDD1 system input signal N1 transits from H level to L level (T=td), the latch node N11 of the latch circuit 110 becomes L level, and the P channel MOS transistor Qhp1 is turned on while the N channel MOS transistor Qhn1 is turned off. Thereby, the voltage of the latch node N10 becomes the VDD2 system H level voltage VDD2, and the P channel MOS transistor Qhp2 is turned off while the N channel MOS transistor Qhn2 is turned on. Accordingly, the voltage at the latch node N11 becomes the ground voltage VSS, and the output terminal OUT1 becomes the low level voltage.

In the state where the input signal IN1 maintains L level or H level, the pulse signal generation circuits C11 and C12 generate no pulse signals, and the output nodes N17 and N19 of the boost voltage generation circuits C21 and C22 are maintained at the VDD1 system H level voltage VDD1, and the voltages at the output nodes N10 and N20 of the logical circuits C31 and C32 are maintained at L level. Accordingly, in this state, the VDD1 system N channel MOS transistor Qln1 and Qln2 are completely off, and the latch circuit 110 maintains the voltage of the latch node as it is.

As described above, according to the first embodiment of the present invention, the voltage level conversion circuit 100a for converting the voltage level of the low voltage input signal IN1 to the voltage level of the high voltage signal includes the latch circuit 110 comprising the high voltage transistors, the pulse signal generation circuit C11 for detecting the rising edge of the input signal to generate the first pulse signal, the pulse signal generation circuit C12 for detecting the falling edge of the input signal to generate the second pulse signal, first and second boost voltage generation circuits C21 and C22 for boosting the first and second pulse signals, and the first and second high voltage N channel MOS transistors Qhn3 and Qhn4 for discharging the one and the other one of the pair of the latch nodes of the latch circuit, respectively, and the boosted first and second pulse signals are applied to the MOS transistors Qhn3 and Qhn4. Therefore, when the low voltage system input signal transits, one of the high voltage transistors for discharging the latch node is temporarily turned on, whereby the latch level of the high voltage latch circuit is reliably inverted. Thereby, the latch circuit comprising the high voltage transistors can be reliably operated with the low voltage system input signal that is lower than the threshold voltage of the high voltage system transistors, resulting in a voltage level conversion circuit which enables a low voltage operation by a lower internal voltage.

Further, in this first embodiment, the latch circuit comprises the P channel MOS transistors Qhp1 and Qhp2 which charge the respective latch nodes N10 and N11, and the N channel MOS transistors Qhn1 and Qhn2 which discharge the respective latch nodes N10 and N11. Therefore, the voltages at the latch nodes can be quickly set to the logic according to the input signal.

Further, in this first embodiment, the low voltage system N channel MOS transistors Qln1 and Qln2 which are controlled by the first and second pulse signals are connected in series to the high voltage system N channel MOS transistors Qhn3 and Qhn4 which discharge the latch nodes, and the outputs of the first and second logical circuits C31 and C32 are applied to the gates of these transistors. Therefore, in the state where the input signal does not transit and is maintained at a constant logical voltage level, the low voltage system N channel MOS transistors Qln1 and Qln2 are completely turned off, thereby preventing leakage current from the latch node that latches the H level voltage to the ground side.

Furthermore, since the low voltage system N channel MOS transistor is connected through the high voltage system N channel MOS transistor to the high power supply voltage VDD2, it is possible to prevent the high power supply voltage VDD2 from being applied to the drain of the low voltage system N channel MOS transistor.

While in this first embodiment the boost voltage generation circuit generates a voltage twice as high as the low power supply voltage VDD1 as a boosted voltage to be applied to the gate of the VDD2 system N channel MOS transistor, the boost voltage generation circuit may generate, as a boosted voltage, a voltage that is higher than the VDD1 voltage by about the threshold voltage of the transistor.

This boost voltage generation circuit can substantially be implemented by connecting an N channel MOS transistor between the power supply voltage VDD1 and the output node OUTH as a boost node, and connecting the drain and gate of the transistor to the output node OUTH, in the boost circuit shown in FIG. 2(b).

Embodiment 2

Figure 4:
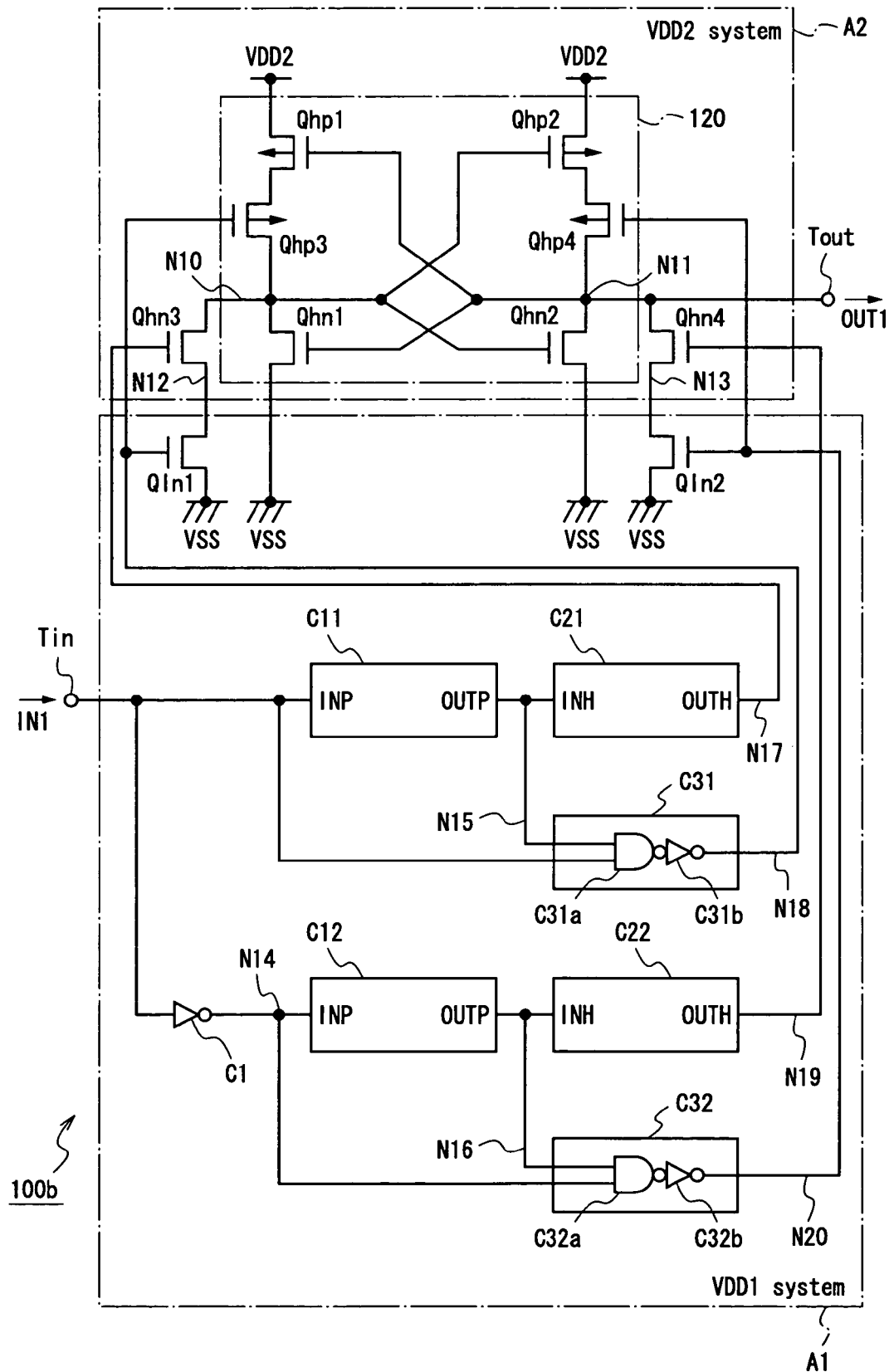
FIG. 4 is a diagram for explaining a voltage level conversion circuit 100b according to a second embodiment of the present invention.

FIG. 4 is a diagram for explaining a voltage level conversion circuit according to a second embodiment of the present invention.

A voltage level conversion circuit 100b according to the second embodiment is provided with a latch circuit 120 comprising six MOS transistors, instead of the latch circuit 110 comprising four MOS transistors according to the first embodiment, and the constituents of the voltage level conversion circuit 100b other than the latch circuit 120 are identical to those described for the first embodiment.

The latch circuit 120 includes a first series circuit in which a first P channel MOS transistor Qhp1, a third P channel MOS transistor Qhp3, and a first N channel MOS transistor Qhn1 are connected in series, successively from the power supply side, between the high power supply voltage VDD2 and the ground voltage VSS; and a second series circuit in which a second P channel MOS transistor Qhp2, a fourth P channel MOS transistor Qhp4, and a second N channel MOS transistor Qhn2 are connected in series, successively from the power supply side, between the high power supply voltage VDD2 and the ground voltage VSS. In this latch circuit 120, a latch node N10 which is a connection point of the N channel MOS transistor Qhn1 and the P channel MOS transistor Qhp3 is connected to the gates of the P channel MOS transistor Qhp2 and the N channel MOS transistor Qhn2. A latch node N11 which is a connection point of the N channel MOS transistor Qhn2 and the P channel MOS transistor Qhp4 is connected to the gates of the P channel MOS transistor Qhp1 and the N channel MOS transistor Qhn1. Further, the gate of the P channel MOS transistor Qhp3 is connected to the output node N18 of the first logical circuit C31, and the gate of the P channel MOS transistor Qhp4 is connected to the output node N20 of the second logical circuit C32.

Next, the operation will be described.

The voltage level conversion circuit 100b according to the second embodiment is different from the circuit 100a of the first embodiment only in the operation of the latch circuit 120 for latching the voltage level of the input signal.

To be specific, in the latch circuit 120 according to the second embodiment, when the VDD1 system input signal N1 transits from L level to H level, a pulse signal which has been waveform-shaped by the first logical circuit C31 is applied to the gate of the low voltage system N channel MOS transistor Qln1 which discharges the latch node N10 and to the gate of the high voltage system P channel MOS transistor Qhp3 of the latch circuit 120, and a pulse signal which has been boosted by the first boost voltage generation circuit C21 is applied to the gate of the high voltage system N channel MOS transistor Qhn3 which discharges the latch node N10. Then, the transistors Qhn3 and Qln1 are turned on, and charges are drawn from the latch node N10 through these transistors Qhn3 and Qln1. At this time, the high voltage system P channel MOS transistor Qhp3 connected between the latch node N10 and the high voltage power supply VDD2 is approximately turned off. Thereby, supply of charges from the high voltage power supply VDD2 to the latch node N10 is minimized, and the voltage of the latch node N10 transits from H level to L level quickly.

On the other hand, when the VDD1 system input signal N1 transits from H level to L level, the transistors Qhn4 and Qln2 are turned on, and charges are drawn from the latch node N11 through these transistors Qhn4 and Qln2. At this time, the high voltage system P channel MOS transistor Qhp4 connected between the latch node N11 and the high voltage power supply VDD2 is approximately turned off. Thereby, supply of charges from the high voltage power supply VDD2 to the latch node N11 is minimized, and the voltage of the latch node N11 transits from H level to L level quickly.

In the state where the input signal IN1 maintains L level or H level, like in the first embodiment, the VDD1 system N channel MOS transistors Qln1 and Qln2 are completely turned off, and the latch circuit 120 maintains the voltage at the latch node as it is.

As described above, the second embodiment of the present invention is provided with, instead of the latch circuit 110 of the first embodiment, the latch circuit 120 comprising the high voltage system P channel MOS transistors Qhp3 and Qhp4, which latches the logical level of the input signal and suppresses supply of charges from the high power supply voltage VDD2 to the latch nodes N10 and N11 when the latch nodes N10 and N11 are discharged. Therefore, when the input signal IN1 transits, the latch node N10 or N11 transits from H level to L level at higher speed, resulting in a voltage level conversion circuit which can operate at a higher speed.

Embodiment 3

Figure 5:
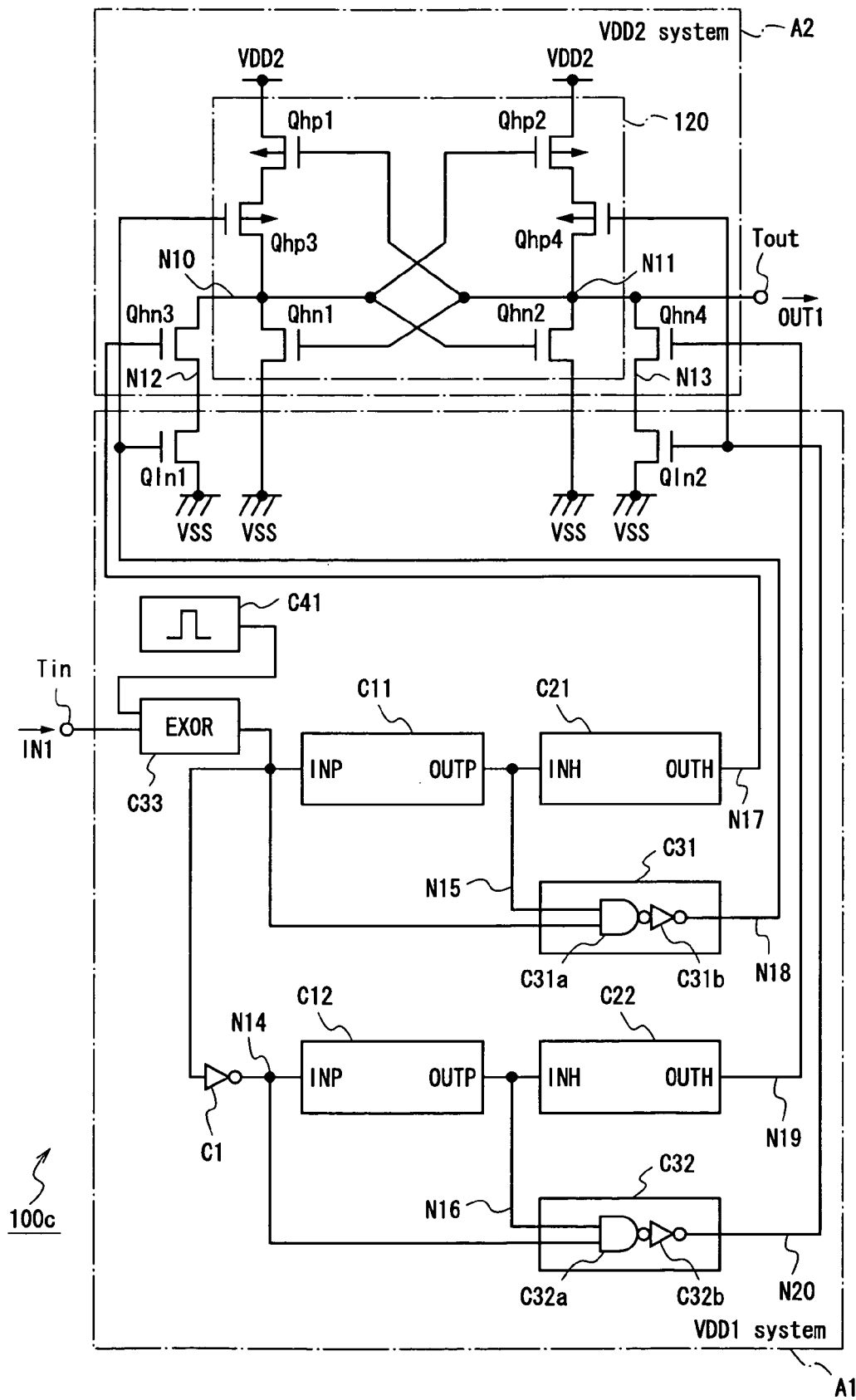
FIG. 5 is a diagram for explaining a voltage level conversion circuit 100c according to a third embodiment of the present invention.

FIG. 5 is a diagram for explaining a voltage level conversion circuit according to a third embodiment of the present invention.

A voltage level conversion circuit 100c according to the third embodiment is provided with a circuit for generating a pulse signal when the circuit 100c is powered on, in addition to the circuits and elements constituting the voltage level conversion circuit 100b according to the second embodiment, and the logical level of the input signal is matched to the logical level of the output signal at power-on.

To be specific, the voltage level conversion circuit 100c according to the third embodiment is provided with a latch circuit 120, first and second pulse signal generation circuits C11 and C12, first and second boost voltage generation circuits C21 and C22, first and second logical circuits C31 and C32, and N channel MOS transistors Qhn3, Qln1, Qhn4, and Qln2 for discharging latch nodes N10 and N11, like the voltage level conversion circuit 100b according to the second embodiment.

The voltage level conversion circuit 100c according to the third embodiment further includes a pulse signal generation circuit C41 for generating a one-shot pulse signal when the circuit 100c is powered on, and an exclusive OR circuit C33 for calculating an exclusive OR of the pulse signal outputted from the pulse signal generation circuit C41 and the input signal IN1, and applying the calculated exclusive OR signal to the pulse signal generation circuit C11, the first logical circuit C31, and the NOT circuit C1. The pulse generation circuit C41 is a VDD1 system circuit.

Next, the operation will be described.

The voltage level conversion circuit 100c according to the third embodiment is different from the voltage level conversion circuit 100b according to the second embodiment only in that the circuit 100c operates, when it is powered on, so as to match the logical level of the input signal to the logical level of the output signal.

To be specific, in the voltage level conversion circuit 100c according to the third embodiment, when it is powered on, the pulse signal generation circuit C41 generates a one-shot pulse signal, and the exclusive OR circuit C33 operates an exclusive OR of the one-shot pulse signal and the input signal, and outputs the operation result.

For example, when the logical level of the input signal is L level at power-on, the logical level of the output signal of the exclusive OR circuit C33 temporarily transits from L level to H level, and thereafter, returns to L level. Therefore, immediately after power-on, the first and second pulse signal generation circuits C11 and C12 successively generate pulse signals, and the latch circuit 120 sets the voltage level of the output terminal Tout to H level, and thereafter, inverts it to L level. Accordingly, when the input signal of the voltage level conversion circuit is L level at power-on, the output signal of the voltage level conversion circuit certainly becomes L level.

On the other hand, when the logical level of the input signal is H level at power-on, the logical level of the output signal of the exclusive OR circuit C33 temporarily transits from H level to L level, and thereafter, returns to H level. Therefore, immediately after power-on, the second and first pulse signal generation circuits C12 and C11 successively generate pulse signals, and the latch circuit 120 sets the voltage level of the output terminal Tout to L level, and thereafter, inverts it to H level. Accordingly, when the input signal of the voltage level conversion circuit is H level at power-on, the output signal of the voltage level conversion circuit surely becomes H level.

As described above, the voltage level conversion circuit 100c according to the third embodiment is provided with the pulse signal generation circuit C41 for generating a one-shot pulse signal when the circuit 100c is powered on, in addition to the circuits and transistors constituting the voltage level conversion circuit 100b of the second embodiment, and an exclusive OR of the one-shot pulse signal and the input signal is output to the first pulse signal generation circuit 11, the first logical circuit C31, and the NOT circuit C1. Therefore, when the circuit 100c is powered on, the logical level of the latch output of the latch circuit 120 changes from the logical level reverse to the logical level of the input signal to the logical level equal to the logical level of the input signal to be reset to the logic corresponding to the input signal. Thereby, immediately after power-on, the logical level of the output signal of the voltage level conversion circuit can be matched to the logical level of the input signal of the voltage level conversion circuit. Accordingly, the voltage level conversion circuit of this third embodiment is also usable as a circuit for changing the voltage level of a DC-like signal from a low voltage system level to a high voltage system level.

While in this third embodiment one voltage level conversion circuit includes one pulse signal generation circuit C41 which generates a one-shot pulse signal at power-on, the pulse signal generation circuit C41 which generates a one-shot pulse signal at power-on may be shared by plural voltage level conversion circuits. In this case, the pulse signal generation circuit C41 generates a one-shot pulse signal at power-on, the one-shot pulse signal is input to the plural voltage level conversion circuits, the exclusive OR circuit in each voltage level conversion circuit performs logical operation of the input signal and the one-shot pulse signal, and the logical level of the output signal is matched to the logical level of the input signal at power-on in each voltage level conversion circuit.

Further, in this third embodiment, the circuit for generating a pulse signal at power-on is added to the voltage level conversion circuit 100b according to the second embodiment, and the logical level of the input signal is matched to the logical level of the output signal at power-on. However, the voltage level conversion circuit according to the third embodiment may be obtained by providing the voltage level conversion circuit 100a according to the first embodiment with the circuit C41 for generating a pulse signal at power-on, and matching the logical level of the input signal to the logical level of the output signal at power-on.

Embodiment 4

According to a fourth embodiment of the present invention, there is provided a voltage level conversion circuit including a latch circuit supplied with a high power supply voltage as a power supply voltage, and the circuit has a fundamental construction in which a high voltage system N channel MOS transistor and a low voltage system N channel MOS transistor are connected in series between a latch node of the latch circuit and a ground voltage supply, and an input signal or an inversion signal thereof is applied to a gate of the low voltage system N channel MOS transistor, while a pulse signal having the logical voltage level of the low voltage system, with the pulse-height voltage being boosted, is applied to a gate of the high voltage system N channel MOS transistor, when the input signal transits.

Figure 6:
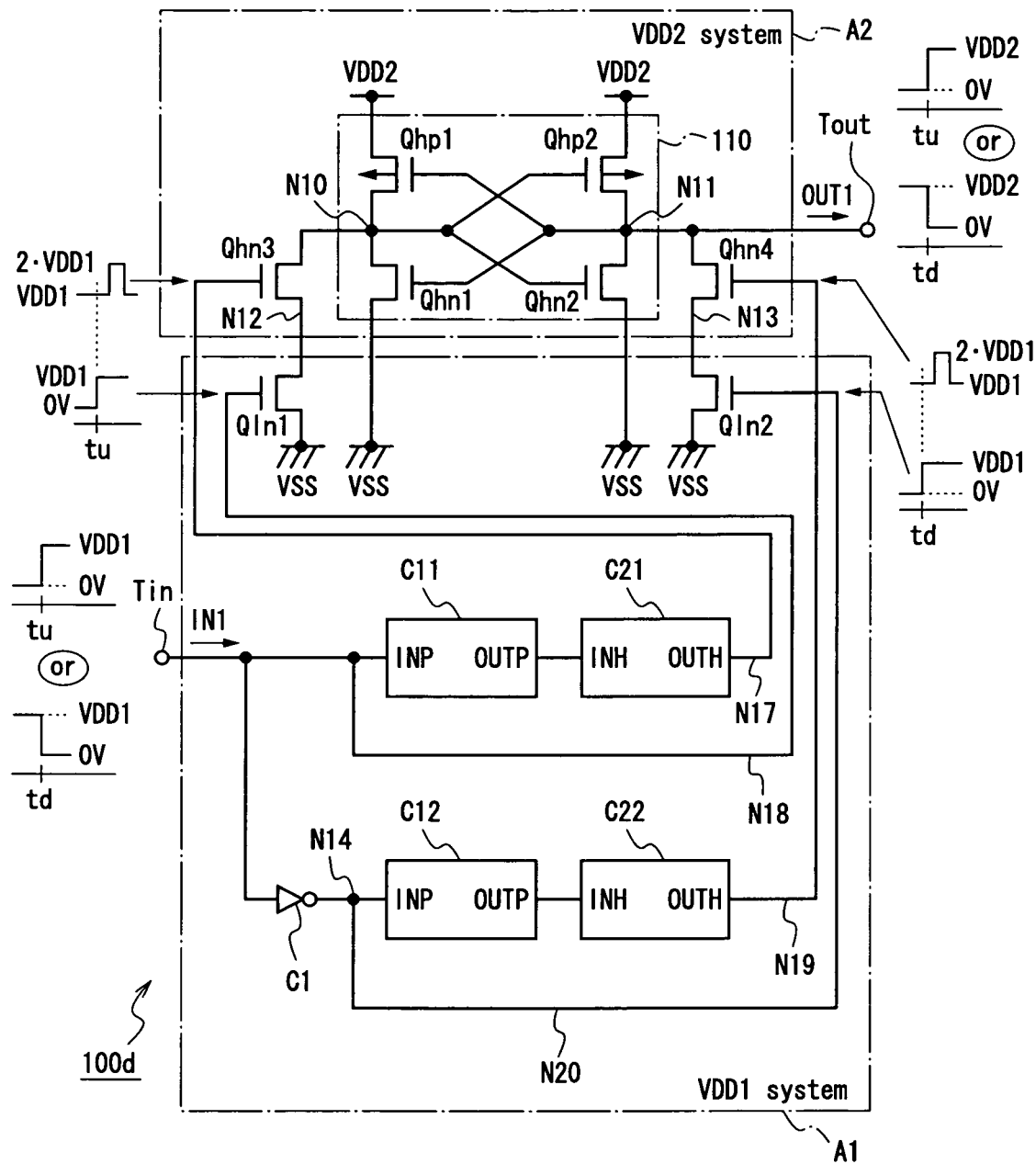
FIG. 6 is a diagram for explaining a voltage level conversion circuit 100d according to a fourth embodiment of the present invention.

FIG. 6 is a circuit diagram illustrating the whole construction of a voltage level conversion circuit 100d according to the fourth embodiment.

The voltage level conversion circuit 100d is, like the first embodiment, a circuit for converting an input signal IN1 having a logical voltage corresponding to the low power supply voltage VDD1 to an output signal OUT1 having a logical voltage corresponding to the high power supply voltage VDD2, and outputting the output signal OUT1. Hereinafter, the voltage level conversion circuit 100d will be described more specifically.

The voltage level conversion circuit 100d includes first and second series circuits each comprising a P channel MOS transistor and an N channel MOS transistor which are connected in series between the high power supply voltage and the ground voltage; a latch circuit 110 using the connection nodes of the transistors in the respective series circuits as a pair of latch nodes N10 and N11; a third series circuit for discharging the latch node N10, which comprises a high voltage system N channel MOS transistor Qhn3 and a low voltage system N channel MOS transistor Qln1 connected in series between the latch node N10 and the ground power supply VSS; and a fourth series circuit for discharging the latch node N11, which comprises a high voltage system N channel MOS transistor Qhn4 and a low voltage system N channel MOS transistor Qln2 connected in series between the latch node N11 and the ground power supply VSS. The latch circuit and the series circuits for discharging the latch nodes are identical to those described for the first embodiment.

Further, the voltage level conversion circuit 100d includes a first pulse signal generation circuit C11 for generating a pulse signal when the logical level of the input signal IN1 transits; and a first boost voltage generation circuit C21 for boosting the logical voltage of the pulse signal outputted from the first pulse signal generation circuit C11, and applying the pulse signal with the boosted logical voltage to the gate of the latch node side MOS transistor Qhn3 of the third series circuit. Further, the voltage level conversion circuit 100d includes a NOT circuit C1 which receives the input signal IN1 and outputs an inversion signal of the input signal; a second pulse signal generation circuit C12 for generating a pulse signal when the logical level of the inversion signal transits; and a second boost voltage generation circuit C22 for boosting the logical voltage of the pulse signal outputted from the second pulse signal generation circuit C12, and applying the pulse signal with the boosted logical voltage to the gate of the latch node side MOS transistor Qhn4 of the fourth series circuit.

The NOT circuit C1, the first and second pulse signal generation circuits C11 and C12, and the first and second boost circuits C21 and C22 are identical to those described for the first embodiment.

In this fourth embodiment, the gate of the ground side transistor Qln1 of the third series circuit is connected to the input terminal Tin, and the gate of the ground side transistor Qln2 of the fourth series circuit is connected to the output node N14 of the NOT circuit C1.

Next, the operation will be described.

In the voltage level conversion circuit 100d, the VDD1 system input signal IN1 applied to the input terminal Tin is converted into a VDD2 system output signal OUT1 to be output from the output terminal Tout.

For example, when the logical level of the VDD1 system input signal IN1 transits from L level to H level, the voltage of the gate of the VDD1 system N channel MOS transistor Qln1 which draws charges out of the latch node N10 changes from L level to H level. At this time, the first pulse signal generation circuit C11 detects the transition of the logical level of the input signal, and generates a VDD1 system one-shot pulse signal synchronized with the rise timing tu of the input signal IN1. When the pulse signal outputted from the first pulse signal generation circuit C11 is input to the first boost voltage generation circuit C21, the first boost voltage generation circuit C21 generates a pulse signal which is obtained by boosting the VDD1 system one-shot pulse signal so that the pulse height voltage VDD1 thereof has a voltage level twice as high as the VDD1 (2·VDD1), and applies this boosted pulse signal to the gate of the VDD2 system P channel MOS transistor Qhn3. At this time, since, in the second pulse signal generation circuit C12, the input signal transits from H level to L level, no transition of the input signal IN1 is detected.

As described above, when the logical level of the VDD1 system input signal IN1 transits from L level to H level, the voltage at the gate of the VDD1 system N channel MOS transistor Qln1 which discharges the one latch node N10 changes from L level to H level, and simultaneously, the boosted VDD1 system pulse signal is applied to the gate of the VDD2 system N channel MOS transistor Qhn3 connected between the latch node N10 and the N channel MOS transistor Qln1. Thereby, the voltage at the latch node N10 becomes L level.

Then, the latch circuit 110 operates in the same manner as described for the first embodiment, whereby the logical level of the output signal OUT1 changes from the L level voltage to the VDD2 system H level voltage.

On the other hand, when the logical level of the VDD1 system input signal IN1 transits from H level to L level, the output signal of the NOT circuit C1 which receives the input signal IN1 transits from L level to H level. Therefore, the voltage at the gate of the VDD1 system N channel MOS transistor Qln2 which draws charges from the latch node N11 changes from L level to H level. At this time, the second pulse signal generation circuit C12 operates in the same manner as the first pulse signal generation circuit C11 to detect the transition of the logical level of the input signal, and outputs a VDD1 system one-shot pulse signal synchronized with the fall timing of the input signal IN1 to the second boost voltage generation circuit C22. At this time, since, in the first pulse signal generation circuit C11, the input signal transits from H level to L level, no transition of the input signal IN1 is detected.

Then, the second boost voltage generation circuit C22 operates in the same manner as the first boost voltage generation circuit C21 to generate a pulse signal which is obtained by boosting the VDD1 system one-shot pulse signal so that the pulse height voltage VDD1 thereof has a voltage level twice as high as the VDD1 (2·VDD1), and applies this boosted pulse signal to the gate of the VDD2 system P channel MOS transistor Qhn4 which draws charges from the latch node N11.

Accordingly, when the logical level of the VDD1 system input signal IN1 transits from H level to L level, the voltage at the gate of the VDD1 system N channel MOS transistor Qln2 which discharges the other latch node N11 changes from L level to H level, and simultaneously, the boosted VDD1 system pulse signal is applied to the gate of the VDD2 system N channel MOS transistor Qhn4 which is connected between the latch node N11 and the N channel MOS transistor Qln2. Thereby, the voltage at the latch node N11 becomes L level.

Then, the latch circuit 110 operates in the same manner as described for the first embodiment, and the logical voltage of the output signal OUT1 changes from the high voltage system H level voltage to the L level voltage.

In the state where the input signal IN1 maintains L level or H level, the pulse signal generation circuits C11 and C12 generate no pulse signals, and the output nodes N17 and N19 of the boost voltage generation circuits C21 and C22 are maintained at the VDD1 system H level voltage VDD1. Accordingly, in this state, the latch circuit 110 holds the voltage of the latch node as it is.

As described above, according to the fourth embodiment, the voltage level conversion circuit 100d for converting the voltage level of the low voltage system input signal to the voltage level of the high voltage system signal is provided with the latch circuit 110 comprising high voltage system transistors, the pulse signal generation circuit C11 for detecting the rising edge of the input signal to generate a first pulse signal, the pulse signal generation circuit C12 for detecting the falling edge of the input signal to generate a second pulse signal, the first and second boost voltage generation circuits C21 and C22 for boosting the first and second pulse signals, and the first and second high voltage system N channel MOS transistors Qhn3 and Qhn4 which discharge the one and the other of the pair of the latch nodes of the latch circuit; and the boosted first and second pulse signals are applied to the MOS transistors Qhn3 and Qhn4, respectively. Therefore, when the low voltage system input signal transits, one of the high voltage system transistors for discharging the latch nodes is temporarily turned on, whereby the latch level of the high voltage system latch circuit is surely inverted. Thereby, the latch circuit comprising the high voltage system transistors can be reliably operated with the input signal of the low voltage system that is lower than the threshold voltage of the high voltage system transistors, thereby providing a voltage level conversion circuit that enables a low voltage operation by a lower internal voltage.

Furthermore, in this fourth embodiment, the low voltage system N channel MOS transistors Qln1 and Qln2 are connected in series to the high voltage system N channel MOS transistors Qhn3 and Qhn4 which discharge the latch nodes, respectively, and the gates of these transistors are supplied with the voltage of the input terminal Tin or the inverted voltage thereof. Therefore, in the state where the input signal is maintained at L level, the low voltage system N channel MOS transistors Qln1 and Qln2 are completely turned off, thereby preventing leakage current from the latch node which latches the H level voltage.

Furthermore, since the low voltage system N channel MOS transistor is connected to the high power supply voltage VDD2 through the high voltage system N channel MOS transistor, it is possible to prevent the high power supply voltage from being applied to the drain of the low voltage system N channel MOS transistor.

Furthermore, in this fourth embodiment, since the low voltage system N channel MOS transistors Qln1 and Qln2 are controlled by the input signal or the inversion signal thereof, the circuit construction for controlling the low voltage system N channel MOS transistors Qln1 and Qln2 can be simplified.

Embodiment 5

Figure 7:
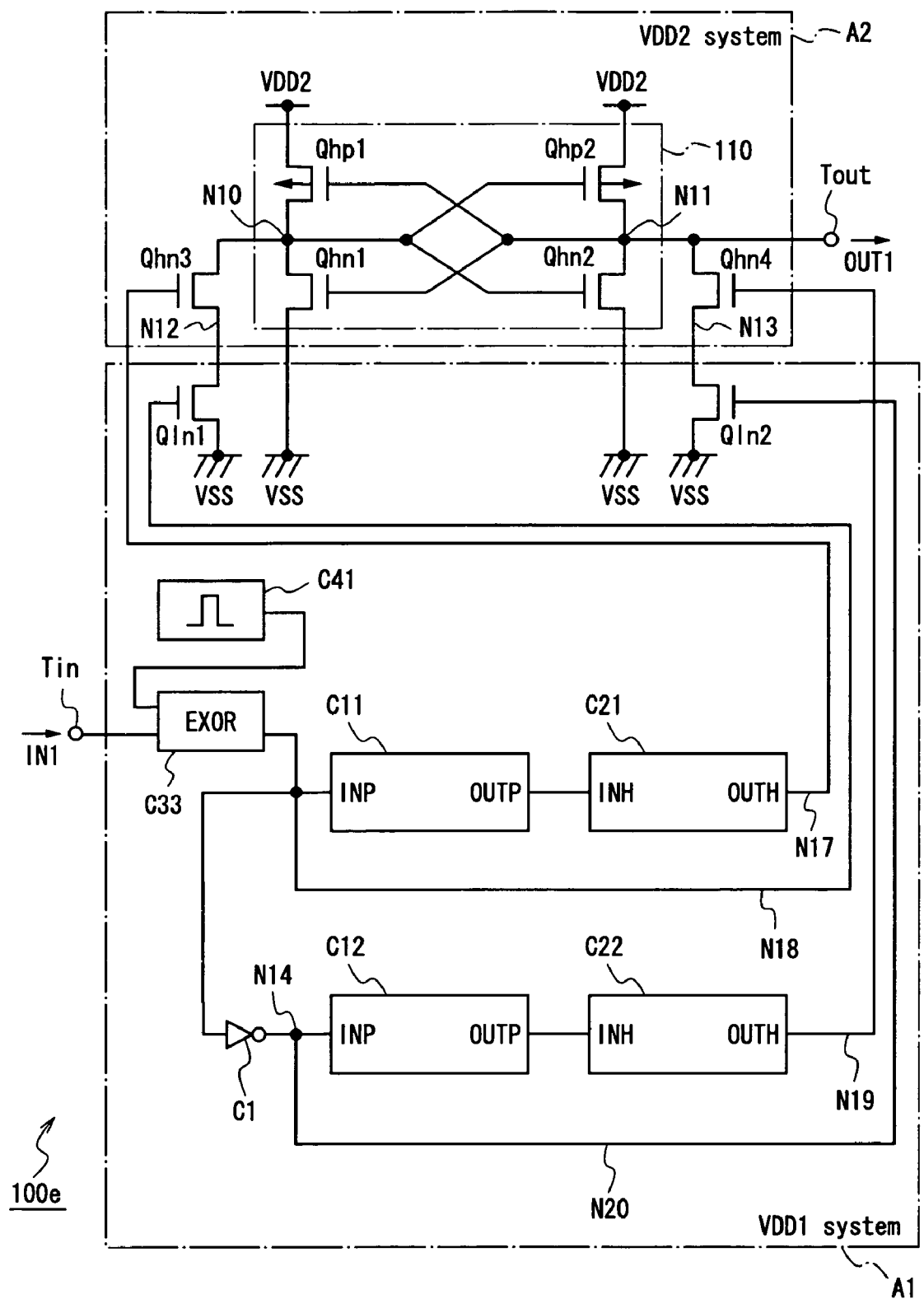
FIG. 7 is a diagram for explaining a voltage level conversion circuit 100e according to a fifth embodiment of the present invention.

FIG. 7 is a diagram for explaining a voltage level conversion circuit according to a fifth embodiment of the present invention.

A voltage level conversion circuit 100e according to the fifth embodiment is provided with a circuit C41 for generating a pulse signal when the circuit 100e is powered on, in addition to the circuits and elements constituting the voltage level conversion circuit 100d according to the fourth embodiment, and the logical level of an input signal is matched to the logical level of an output signal at power-on.

To be specific, the voltage level conversion circuit 100e according to the fifth embodiment is provided with a latch circuit 110, first and second pulse signal generation circuits C11 and C12, first and second boost voltage generation circuits C21 and C22, and N channel MOS transistors Qhn3, Qln1, Qhn4, and Qln2 for discharging latch nodes N10 and N11, like the voltage level conversion circuit 100d according to the fourth embodiment.

The voltage level conversion circuit 100e according to the fifth embodiment further includes a pulse signal generation circuit C41 for generating a one-shot pulse signal when the circuit 100e is powered on, and an exclusive OR circuit C33 for calculating an exclusive OR of the pulse signal outputted from the pulse signal generation circuit C41 and the input signal IN1, and applying the calculated exclusive OR signal to the first pulse signal generation circuit C11, the NOT circuit C1, and the N channel MOS transistor Qln1. The pulse generation circuit C41 is a VDD1 system circuit.

Next, the operation will be described.

The voltage level conversion circuit 100e according to the fifth embodiment is different from the voltage level conversion circuit 100d according to the fourth embodiment only in that the circuit 100e operates, when it is powered on, so as to match the logical level of the input signal to the logical level of the output signal.

To be specific, when the voltage level conversion circuit 100e according to the fifth embodiment is powered on, the pulse signal generation circuit C41 generates a one-shot pulse signal, and the exclusive OR circuit C33 performs an exclusive OR of the one-shot pulse signal and the input signal, and outputs the operation result.

For example, when the logical level of the input signal is L level at power-on, the logical level of the output signal of the exclusive OR circuit C33 temporarily transits from L level to H level, and thereafter, returns to L level. Therefore, immediately after power-on, the first and second pulse signal generation circuits C11 and C12 successively generate pulse signals, and the latch circuit 110 sets the voltage level of the output terminal Tout to H level, and thereafter, inverts it to L level. Accordingly, when the input signal of the voltage level conversion circuit is L level at power-on, the output signal of the voltage level conversion circuit certainly becomes L level.

On the other hand, when the logical level of the input signal is H level at power-on, the logical level of the output signal of the exclusive OR circuit C33 temporarily transits from H level to L level, and thereafter, returns to H level. Therefore, immediately after power-on, the second and first pulse signal generation circuits C12 and C11 successively generate pulse signals, and the latch circuit 110 sets the voltage level of the output terminal Tout to L level, and thereafter, inverts it to H level. Accordingly, when the input signal of the voltage level conversion circuit is H level at power-on, the output signal of the voltage level conversion circuit surely becomes H level.

As described above, the voltage level conversion circuit 100e according to the fifth embodiment is provided with the pulse signal generation circuit C41 for generating a one-shot pulse signal when the circuit 100e is powered on, in addition to the circuits and transistors constituting the voltage level conversion circuit 100d of the fourth embodiment, and an exclusive OR of the one-shot pulse signal and the input signal is output to the first pulse signal generation circuit 11, the gate of the N channel MOS transistor Qlp1, and the NOT circuit C1. Therefore, when the circuit 100c is powered on, the logical level of the latch output of the latch circuit 110 changes from the logical level reverse to the logical level of the input signal to the logical level equal to the logical level of the input signal to be reset to the logic corresponding to the input signal. Thereby, immediately after power-on, the logical level of the output signal of the voltage level conversion circuit can be matched to the logical level of the input signal of the voltage level conversion circuit. Accordingly, the voltage level conversion circuit 100e of this fifth embodiment is also usable as a circuit for changing the voltage level of a DC-like signal from a low voltage system level to a high voltage system level.

While in this fifth embodiment one voltage level conversion circuit includes one pulse signal generation circuit C41 which generates a one-shot pulse signal at power-on, the pulse signal generation circuit C41 which generates a one-shot pulse signal at power-on may be shared by plural voltage level conversion circuits. In this case, the pulse signal generation circuit C41 generates a one-shot pulse signal at power-on, the one-shot pulse signal is input to the plural voltage level conversion circuits, the exclusive OR circuit in each voltage level conversion circuit performs logical operation between the input signal and the one-shot pulse signal, and the logical level of the output signal is matched to the logical level of the input signal at power-on in each voltage level conversion circuit.

Embodiment 6

Figure 8:
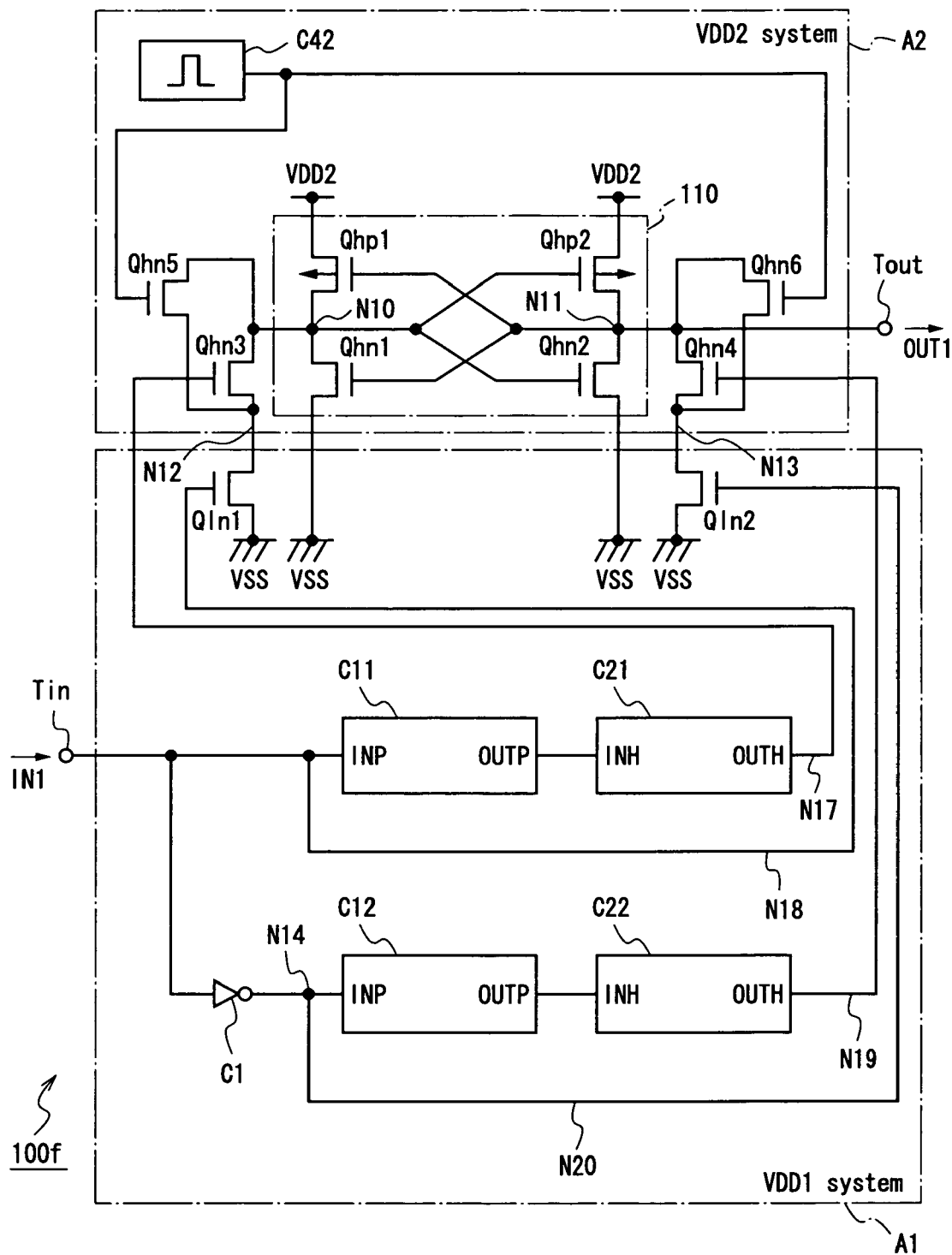
FIG. 8 is a diagram for explaining a voltage level conversion circuit 100f according to a sixth embodiment of the present invention.

FIG. 8 is a diagram for explaining a voltage level conversion circuit according to a sixth embodiment of the present invention.

A voltage level conversion circuit 100f according to the sixth embodiment is provided with a circuit C42 for generating a pulse signal when the circuit 100f is powered on, in addition to the circuits and elements constituting the voltage level conversion circuit 100d according to the fourth embodiment, and the logical level of an input signal is matched to the logical level of an output signal at power-on.

To be specific, the voltage level conversion circuit 100f according to the sixth embodiment is provided with a latch circuit 110, first and second pulse signal generation circuits C11 and C12, first and second boost voltage generation circuits C21 and C22, and N channel MOS transistors Qhn3, Qln1, Qhn4, and Qln2 for discharging latch nodes N10 and N11, like the voltage level conversion circuit 100d according to the fourth embodiment.

The voltage level conversion circuit 100f according to the sixth embodiment further includes a pulse signal generation circuit C42 for generating a one-shot pulse signal when the circuit 100f is powered on, a high voltage system N channel MOS transistor Qhn5 which is connected in parallel to the high voltage system N channel MOS transistor Qhn3 that discharges the latch node N10, and a high voltage system N channel MOS transistor Qhn6 which is connected in parallel to the high voltage system N channel MOS transistor Qhn4 that discharges the latch node N11, and the one-shot pulse signal generated by the pulse signal generation circuit C42 at power-on is applied to the gates of the MOS transistors Qhn5 and Qhn6.

Next, the operation will be described.

The voltage level conversion circuit 100f according to the sixth embodiment is different from the voltage level conversion circuit 100d according to the fourth embodiment only in that the circuit 100f operates so as to match the logical level of the input signal to the logical level of the output signal when it is powered on.

To be specific, when the voltage level conversion circuit 100f according to the sixth embodiment is powered on, the pulse signal generation circuit C42 generates a one-shot pulse signal, and applies the one-shot pulse signal to the gates of the N channel MOS transistors Qhn5 and Qhn6. Thereby, immediately after power-on, the N channel MOS transistors Qhn5 and Qhn6 are temporarily turned on.

Accordingly, when the logical level of the input signal is L level, the voltage of the latch node N11 temporarily becomes L level, and the latch circuit 110 sets the voltage level of the output terminal Tout to L level. Accordingly, when the input signal of the voltage level conversion circuit is L level at power-on, the output signal of the voltage level conversion circuit certainly becomes L level.

On the other hand, when the logical level of the input signal is H level at power-on, the N channel MOS transistor Qln1 that discharges the latch node N10 is turned on. In this state, when the voltage of the latch node N10 temporarily becomes L level due to the pulse signal from the pulse signal generation circuit C42, the latch circuit 110 sets the voltage level of the output terminal Tout to H level. Accordingly, when the input signal of the voltage level conversion circuit is H level at power-on, the output signal of the voltage level conversion circuit surely becomes H level.

As described above, the voltage level conversion circuit 100f according to the sixth embodiment is provided with the high voltage system N channel MOS transistor Qhn5 which is connected in parallel to the high voltage system N channel MOS transistor Qhn3 that discharges the latch node N10, and the high voltage system N channel MOS transistor Qhn6 which is connected in parallel to the high voltage system N channel MOS transistor Qhn4 that discharges the latch node N11, in addition to the circuits and transistors constituting the voltage level conversion circuit 100d according to the fourth embodiment, and a one-shot pulse signal generated by the pulse signal generation circuit C42 is applied to the gates of the MOS transistors Qhn5 and Qhn6 at power-on. Therefore, when the circuit 100f is powered on, the logical level of the latch output of the latch circuit 110 changes to the logical level equal to the logical level of the input signal to be reset to the logic corresponding to the input signal. Thereby, immediately after power-on, the logical level of the output signal of the voltage level conversion circuit can be matched to the logical level of the input signal of the voltage level conversion circuit. Accordingly, the voltage level conversion circuit of this sixth embodiment is also usable as a circuit for changing the voltage level of a DC-like signal from a low voltage system level to a high voltage system level.

While in this sixth embodiment one voltage level conversion circuit includes one pulse signal generation circuit C42 which generates a one-shot pulse signal at power-on, the pulse signal generation circuit C42 which generates a one-shot pulse signal at power-on may be shared by plural voltage level conversion circuits. In this case, the pulse signal generation circuit C42 generates a one-shot pulse signal at power-on, the one-shot pulse signal is input to the plural voltage level conversion circuits, the transistor connected in parallel to the transistor which discharges the latch node is temporarily turned on in each voltage level conversion circuit, and the logical level of the output signal is matched to the logical level of the input signal at power-on in each voltage level conversion circuit.

Embodiment 7

According to a seventh embodiment of the present invention, there is provided a voltage level conversion circuit including a latch circuit that is supplied with a high power supply voltage as a power supply voltage, and the voltage level conversion circuit has a fundamental construction in which a high voltage system N channel MOS transistor is connected between a latch node of the latch circuit and a ground power supply, and when an input signal transits, a pulse signal having a logical voltage level of a low voltage system, the logical voltage level of which is boosted to be twice as high, is applied to the gate of the high voltage system N channel MOS transistor.

Figure 9:
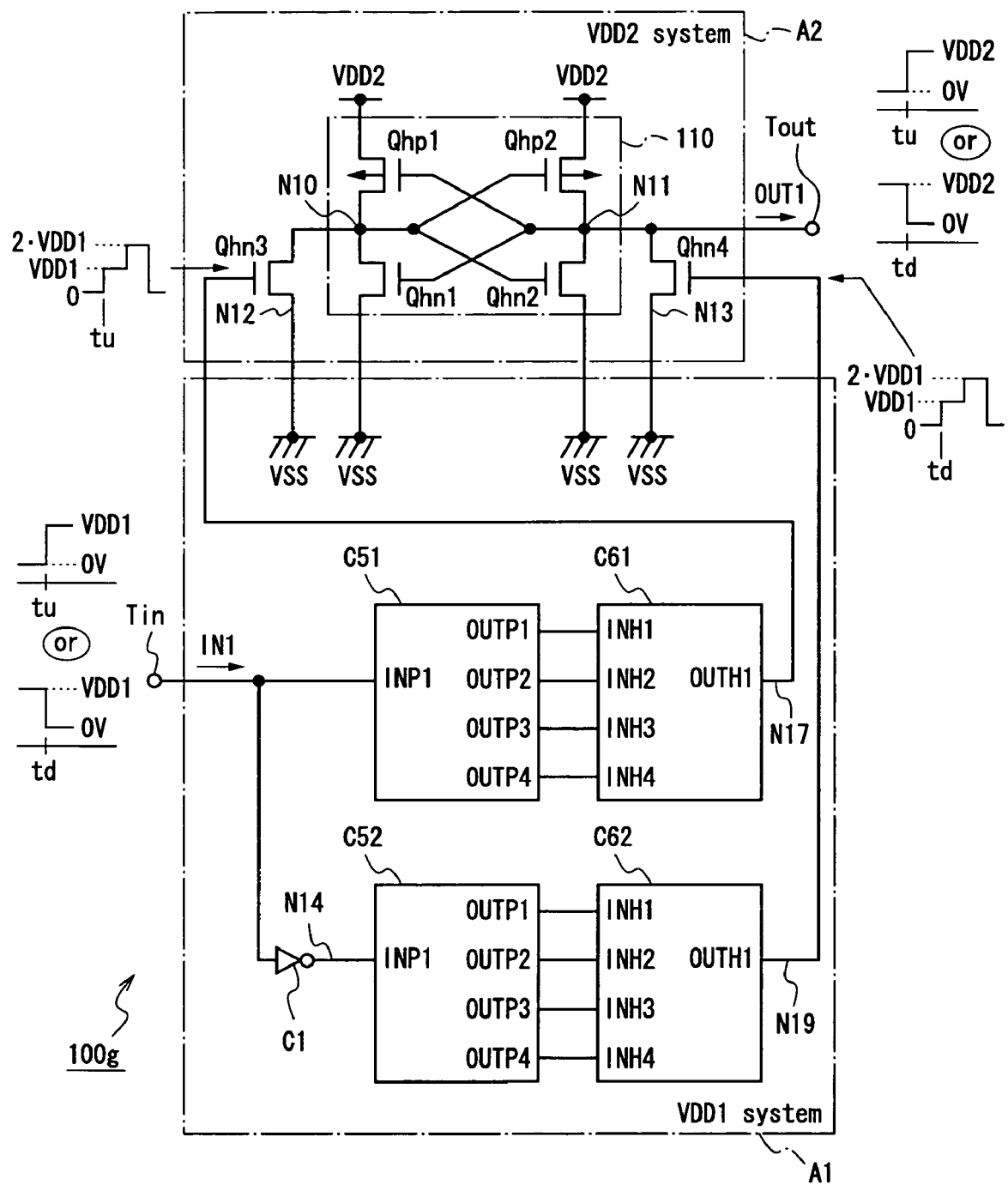
FIG. 9 is a diagram for explaining a voltage level conversion circuit 100g according to a seventh embodiment of the present invention.

FIG. 9 is a circuit diagram illustrating the whole construction of the voltage level conversion circuit 100g according to the seventh embodiment.

The voltage level conversion circuit 100g is a circuit for converting an input signal IN1 having a logical voltage corresponding to a low power supply voltage VDD1 into an output signal OUT1 having a logical voltage corresponding to a high power supply voltage VDD2, and outputting the output signal OUT1. Hereinafter, the voltage level conversion circuit 100g will be described in detail.

The voltage level conversion circuit 100g includes a latch circuit 110 of the same construction as that of the first embodiment; a third VDD2 system N channel MOS transistor Qhn3 connected between one latch node N10 of the latch circuit 110 and the ground voltage VSS; and a fourth VDD2 system N channel MOS transistor Qhn4 connected between the other latch node N11 of the latch circuit 110 and the ground voltage VSS. The four MOS transistors Qhp1, Qhp2, Qhn1, and Qhn2 constituting the latch circuit 110 and the third and fourth N channel MOS transistors Qhn3 and Qhn4 are high-breakdown voltage transistors having high threshold values, and belong to a circuit system (VDD2 system) A2 that is driven by the high power supply voltage VDD2.

The voltage level conversion circuit 100g further includes a first signal generation circuit C51 which receives the input signal IN1 and outputs logical signals from four output nodes OUTP1~OUTP4 on the basis of the input signal IN1; and a first boost voltage generation circuit C61 which has four input nodes INH1~INH4 to which the four logical signals outputted from the signal generation circuit C51 are input, generates a logical signal obtained by boosting the voltage level of the low voltage system logical signal, and applies the boosted logical signal to the gate of the third N channel MOS transistor Qhn3. Further, the voltage level conversion circuit 100g includes a NOT circuit C1 for inverting the input signal IN1; a second signal generation circuit C52 which outputs logical signals from four output nodes OUTP1~OUTP4 on the basis of the output signal of the NOT circuit; and a second boost voltage generation circuit C62 which has four input nodes INH1~INH4 to which the four logical signals outputted from the signal generation circuit C52 are input, generates a logical signal obtained by boosting the voltage level of the low voltage system logical signal, and applies the boosted logical signal to the gate of the fourth N channel MOS transistor Qhn4.

The NOT circuit C1, the first and second signal generation circuits C51 and C52, and the first and second boost voltage generation circuits C61 and C62 are driven by the low power supply voltage VDD1, and hereinafter these circuits will be described in detail.

Figure 10:
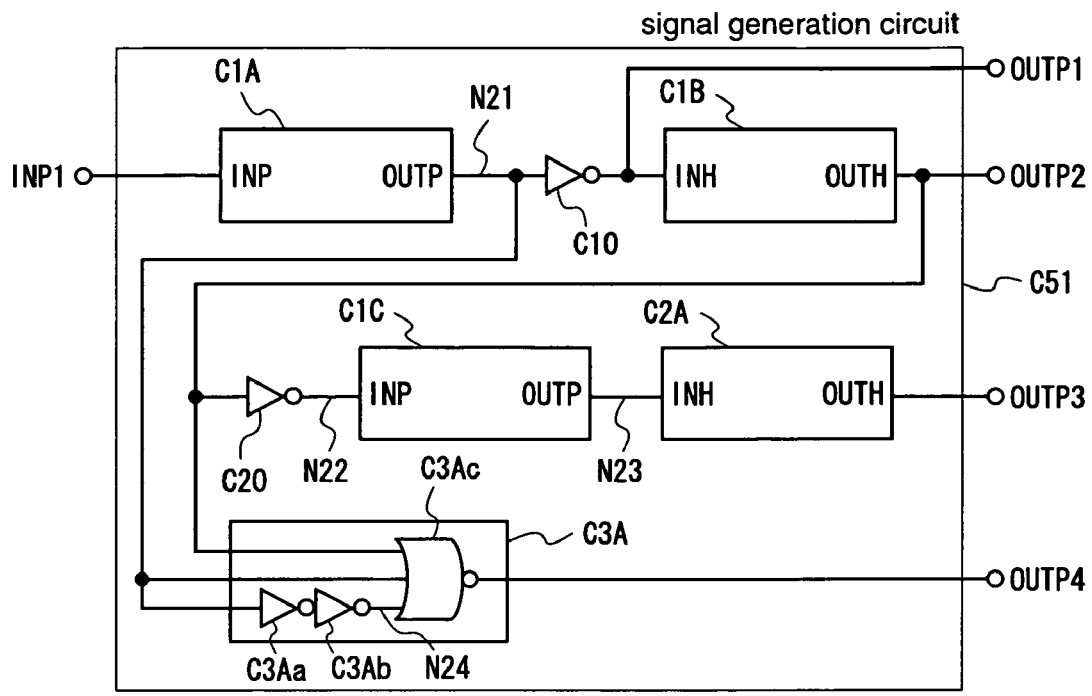
FIG. 10(a) is a diagram for explaining a signal generation circuit C51 included in the voltage level conversion circuit 100g according to the seventh embodiment.
FIG. 10(b) is a diagram for explaining a boost circuit C61 included in the voltage level conversion circuit 100g according to the seventh embodiment.
Figure 10:
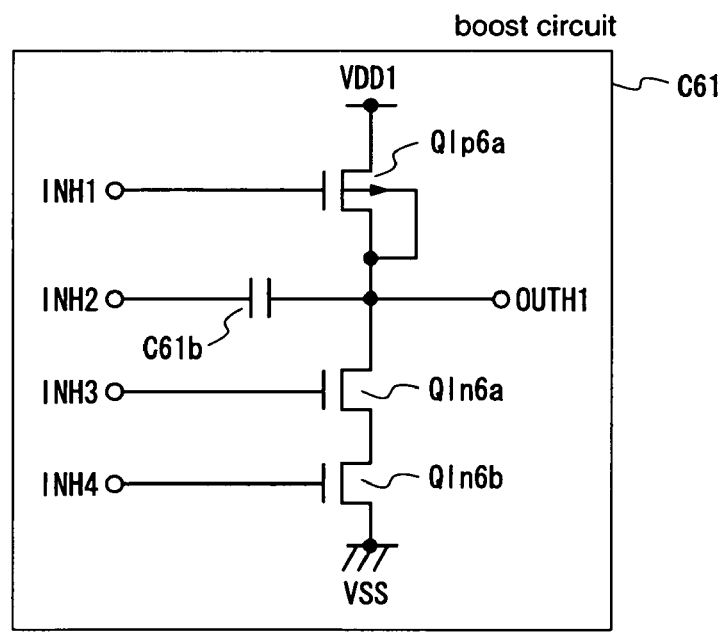

FIG. 10(a) is a diagram for explaining the specific circuit construction of the first signal generation circuit C51.

The first signal generation circuit C51 has one input node INP1, and four, i.e., first to fourth, output nodes OUTP1 to OUTP4. The first signal generation circuit C51 has a first pulse signal generation circuit C1A for generating a pulse signal in synchronization with the rise timing t1 (=tu) of the input signal IN1 that is applied to the input node INP1, and a NOT circuit C10 for inverting the voltage of an output node N21 of the circuit C1A, and outputting the inversion signal to the first output node OUTP1.

The first signal generation circuit C51 has a second pulse signal generation circuit C1B for generating a pulse signal in synchronization with the rise timing t2 of the inversion signal outputted to the output node OUTP1, and outputting the pulse signal to the second output node OUTP2, and a NOT circuit C20 which receives the signal from the second output node OUTP2.

Further, the first signal generation circuit C51 has a third pulse signal generation circuit C1C for generating a pulse signal in synchronization with the rise timing t3 of the inversion signal outputted to the output node N22 of the NOT circuit C20; a boost voltage generation circuit C2A for boosting the logical voltage of the pulse signal outputted from the circuit C1C, and outputting the pulse signal with the boosted logical voltage to the third output node OUTP3; and a logical circuit C3A which receives the outputs of the first and second pulse signal generation circuits C1A and C1B.

The first to third pulse signal generation circuits C1A to C1C have the same circuit construction as the first pulse signal generation circuit C11 according to the first embodiment shown in FIG. 2(a), and the boost voltage generation circuit C2A has the same circuit construction as the first boost voltage generation circuit C21 according to the first embodiment shown in FIG. 2(b). The logical circuit C3A is composed of two stages of NOT circuits C3Aa and C3Ab for delaying the output signal of the first pulse signal generation circuit C1A; and a three-input NOR circuit C3Ac which has, as input nodes, an output node N24 of the subsequent NOT circuit C3Ab, an output node N21 of the first pulse signal generation circuit C1A, and the output node OUTP2 of the second pulse signal generation circuit C1B, and outputs an OR of logical signals from these output nodes to the fourth output node OUTP4.

The second signal generation circuit C52 has the same circuit construction as the first signal generation circuit C51 shown in FIG. 10(a).

FIG. 10(b) is a diagram for explaining the specific circuit construction of the first boost voltage generation circuit C61.

The first boost voltage generation circuit C61 has four, i.e., first to fourth, input nodes INH1~INH4, and one output node OUTH1. The first boost voltage generation circuit C61 includes a low voltage system P channel MOS transistor Qlp6a connected between the low power supply voltage VDD1 and the output node OUTH1; low voltage system N channel MOS transistors Qln6a and Qln6b connected in series between the output node OUTH1 and the ground voltage VSS; and a capacitor C61b connected between the second input node INH2 and the output node OUTH1. The first input node INH1 is connected to the gate of the P channel MOS transistor Qlp6a, and the third and fourth input nodes INH3 and INH4 are connected to the gates of the low voltage system N channel MOS transistors Qln6a and Qln6b, respectively.

Next, the operation will be described.

In the voltage level conversion circuit 100g, the VDD1 system input signal IN1 applied to the input terminal Tin is converted into a VDD2 system output signal OUT1 to be outputted from the output terminal Tout.

For example, when the logical level of the input signal IN1 inputted to the input terminal Tin transits from L level to H level (T=tu), the first signal generation circuit C51 outputs, on the basis of the input signal IN1, four logical signals from the output nodes OUTP1~OUTP4 to the corresponding four input nodes INH1~INH4 of first boost voltage generation circuit C61. Then, the first boost voltage generation circuit C61 generates a pulse signal which is boosted to a voltage twice as high as the low power supply voltage VDD1, and applies the pulse signal to the gate of the high voltage system N channel MOS transistor Qhn3.

Since the inversion signal of the input signal is input to the second signal generation circuit C52, when the logical level of the input signal IN1 transits from L level to H level (T=tu), the voltage level of the input node INP1 of the second signal generation circuit C52 changes from H level to L level. Therefore, the first pulse signal generation circuit C1A in the second signal generation circuit C52 generates no pulse signal, and the second signal generation circuit C52 and the subsequent second boost voltage generation circuit C62 do not operate. Accordingly, the N channel transistor for discharging the latch node N11 of the latch circuit 110 does not operate.

On the other hand, when the logical level of the input signal IN1 applied to the input terminal Tin transits from H level to L level (T=td), the second signal generation circuit C52 output four logical signals from the output nodes OUTP1~OUTP4 to the corresponding four input nodes INH1~INH4 of the second boost voltage generation circuit C62, on the basis of the output signal of the NOT circuit C1 which is an inversion signal of the input signal IN1. Then, the second boost voltage generation circuit C62 generates a pulse signal which is boosted to a voltage twice as high as the low power supply voltage VDD1, on the basis of the four output signals from the second signal generation circuit C52, and applies the pulse signal to the gate of the high voltage system N channel MOS transistor Qhn4.

Since the input signal is applied to the first signal generation circuit C51, when the logical level of the input signal IN1 transits from H level to L level (T=td), the voltage level of the input node INP1 of the first signal generation circuit C51 changes from H level to L level. Therefore, the first pulse signal generation circuit C1A in the first signal generation circuit C51 generates no pulse signal, and the first signal generation circuit C51 and the subsequent first boost voltage generation circuit C61 do not operate. Accordingly, the N channel transistor for discharging the latch node N10 of the latch circuit 110 does not operate.

Hereinafter, the operations of the first signal generation circuit C51 and the first boost circuit will be described in detail.

Figure 11:
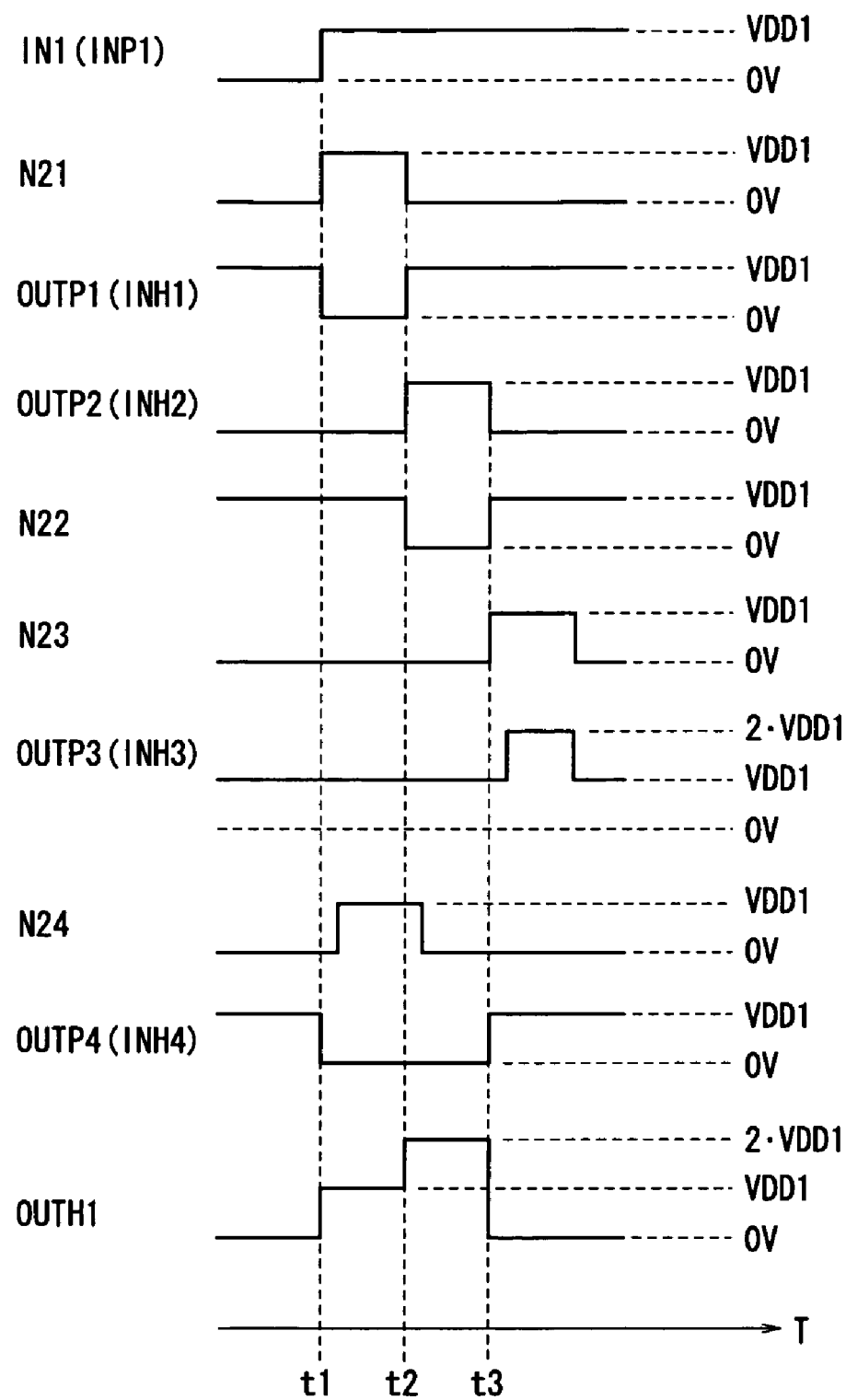
FIG. 11 is a signal waveform diagram for explaining the operations of the signal generation circuit C51 (C52) and the boost voltage generation circuit C61 (C62) according to the seventh embodiment.

FIG. 11 is a diagram for explaining variations in the voltage levels at the input node and the output node of the first signal generation circuit C51.

The first signal generation circuit C51 is operated by the level change in the input signal.

That is, when the voltage of the input node INP1 of the signal generation circuit C51 changes from L level to H level (T=t1=tu), the first pulse signal generation circuit C1A generates a one-shot pulse synchronized with the change of the voltage level, and the NOT circuit C10 inverts the voltage of the first pulse signal generation circuit C1A and outputs the inversion signal to the first output node OUTP1. Then, the second pulse signal generation circuit C1B generates a one-shot pulse signal in synchronization with the rising edge of the output signal from the NOT circuit C10 (T=t2), and outputs the one-shot pulse signal to the output node OUTP2. The NOT circuit C20 inverts the voltage of the output node OUTP2 and outputs it to the third pulse signal generation circuit C1C. Then, the third pulse signal generation circuit C1C outputs the one-shot pulse signal to the boost voltage generation circuit C2A in synchronization with the rising edge of the output signal of the NOT circuit C20 (T=t3), and the boost voltage generation circuit C2A boosts the pulse signal from the third pulse signal generation circuit C1C, and outputs the boosted signal to the third output node OUTP3. Further, the logical circuit C3A performs an OR of the output signal of the first pulse signal generation circuit C1A, this output signal delayed by the two stages of NOT circuits C3Aa and C3Ab, and the output signal of the second pulse signal generation circuit C1B, and outputs an OR signal to the fourth output node OUTP4.

The first boost circuit C61 operates with the four logical signals outputted from the output nodes of the first signal generation circuit C51 being input signals.

To be specific, in the state where the input signal is L level, the input nodes INH1, INH3, and INH4 are supplied with the H level voltage VDD1, and accordingly, the P channel MOS transistor Qlp6a is in its off state while the N channel MOS transistors Qln6a and Qln6b are in their on states, and the output node OUTH1 is supplied with the ground voltage VSS. At this time, the input node INH2 is at L level, and the both electrodes of the capacitor C61b are supplied with the ground voltage VSS (0 v).

In this state, when the input signal IN1 changes from L level to H level (T=t1), the input nodes INH1 and INH4 change from H level to L level, whereby the P channel MOS transistor Qlp6a is turned on while the N channel MOS transistor Qln6b is turned off. Thereby, charging of the output node OUTH1 is started, and the voltage level becomes the power supply voltage VDD1. Thereafter, when the input node INH1 changes from L level to H level (T=t2), the P channel MOS transistor Qlp6a is turned off, whereby the output node OUTH1 goes in the floating state. When the voltage level of the input node INH2 changes from L level to H level simultaneously with the level change in the input node INH1, the output node OUTH1 is boosted from the power supply voltage VDD1 to a voltage twice as high as the VDD1, and the boosted voltage is applied to the high voltage system N channel MOS transistor Qhn3. Thereby, the high voltage system N channel MOS transistor Qhn3 is turned on, and the latch node N10 of the latch circuit 110 becomes L level and the output node Tout of the latch circuit 110 becomes H level that corresponds to the logical level of the input signal. Further, in the boost circuit C61, when the output node OUTH1 is boosted to a voltage twice as high as the power supply voltage VDD1, the high potential side terminal voltage of the N channel MOS transistor Qln6a becomes twice as high as the gate voltage, whereby this transistor Qln6a is turned off.

Thereafter, when the input node INH4 changes from L level to H level (T=t3), the N channel MOS transistor Qln6b is turned on. Immediately after the turn-on, the voltage of the input node INH3 is boosted from the power supply voltage VDD1 to a voltage twice as high as the VDD1, and the N channel MOS transistor Qln6a is turned on, and thereby the output node OUTH1 of the boost circuit C61 is discharged to be the ground voltage VSS, i.e., L level.

Further, when the input signal changes from H level to L level (T=td), the second pulse signal generation circuit C52 and the second boost circuit C62 detect that the output signal of the NOT circuit C1 that inverts the input signal changes from L level to H level, and operate in the same manners as the first pulse signal generation circuit C51 and the first boost circuit C61, respectively, to apply the boosted pulse signal to the gate of the high voltage system P channel MOS transistor Qhn4 of the latch circuit 110. Thereby, the latch node N11 of the latch circuit becomes L level, and the voltage of the output node Tout of the latch circuit becomes L level that corresponds to the logical level of the input signal.

When the input signal does not transit, the gates of the VDD2 system N channel MOS transistors Qhn3 and Qhn4 connected to the latch nodes N10 and N11 are at the ground voltage, and these transistors are completely turned off, whereby the latch circuit maintains the latch state.

As described above, according to the seventh embodiment, the voltage level conversion circuit 100g for converting the voltage level of the low voltage system input signal to the voltage level of the high voltage system signal is provided with the latch circuit 110 comprising the high voltage system transistors, the first signal generation circuit C51 for detecting the rising edge of the input signal to generate plural logical signals, the second signal generation circuit C52 for detecting the falling edge of the input signal to generate plural logical signals, the first boost circuit C61 for generating the boosted first pulse signal on the basis of the output signal of the first signal generation circuit C51, the second boost circuit C62 for generating the boosted second pulse signal on the basis of the output signal of the second signal generation circuit C52, and the first and second high voltage system N channel MOS transistors Qhp3 and Qhp4 for discharging one and the other of the pair of latch nodes of the latch circuit; and the boosted first and second pulse signals are applied to the MOS transistors Qhp3 and Qhp4, respectively. Therefore, it is possible to completely turn on or off the high-breakdown-voltage transistors for discharging the latch nodes. That is, when the low voltage system input signal transits, one of the high voltage system transistors for discharging the latch nodes is temporarily turned on, whereby the latch level of the high voltage system latch circuit is surely inverted. Therefore, the latch circuit comprising the high voltage system transistors can be reliably operated with the low voltage system input signal that is lower than the threshold voltage of the high voltage system transistors, thereby providing a voltage level conversion circuit that enables a low voltage operation with a lower internal voltage. Further, in the state where the logical level of the input signal is constant, the N channel MOS transistors for discharging the latch nodes are completely turned off, thereby realizing a voltage level conversion circuit having no leakage current.

While in this seventh embodiment the boost circuit generates a voltage twice as high as the power supply voltage VDD1 as a boosted voltage to be applied to the gate of the VDD2 system N channel MOS transistor, this boost circuit may generate, as a boosted voltage, a voltage that is higher than the VDD1 voltage by about the threshold value of the transistor.

To be more precise, this boost circuit can be realized by, in the boost circuit shown in FIG. 10(b), connecting an N channel MOS transistor between the low power supply voltage VDD1 and the output node OUTH1 as a boost node, and connecting the drain and gate of the transistor to the output node OUTH1.

Embodiment 8

Figure 12:
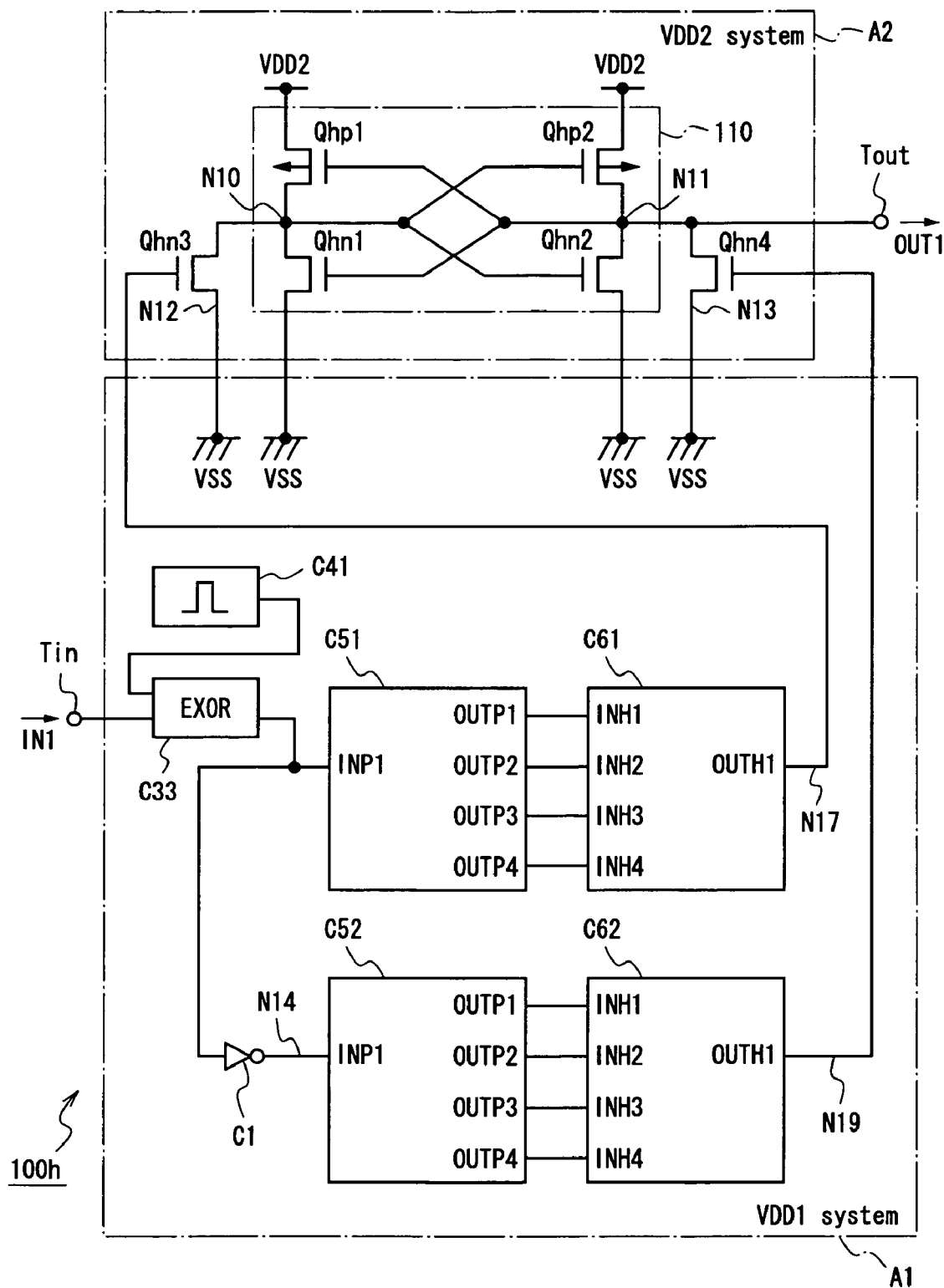
FIG. 12 is a diagram for explaining a voltage level conversion circuit 100h according to an eighth embodiment of the present invention.
Figure 13:
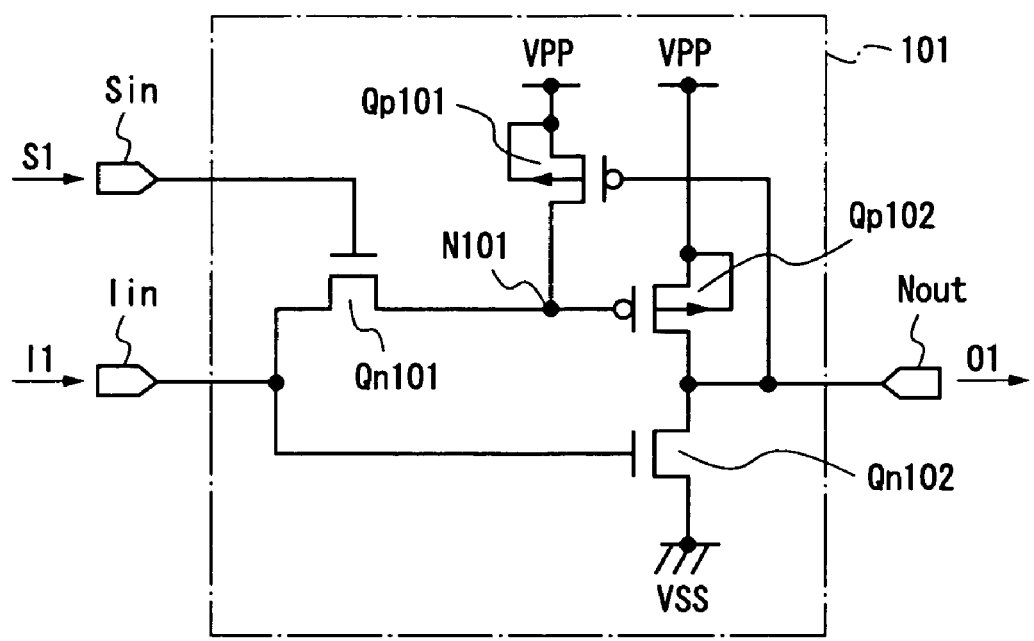
FIG. 13 is a diagram for explaining the conventional voltage level conversion circuit.

FIG. 12 is a diagram for explaining a voltage level conversion circuit according to an eighth embodiment of the present invention.

A voltage level conversion circuit 100h according to the eighth embodiment is provided with a circuit C41 for generating a pulse signal when the circuit 100h is powered on, in addition to the circuits and elements constituting the voltage level conversion circuit 100g according to the seventh embodiment, and the logical level of the input signal is matched to the logical level of the output signal at power-on.

That is, the voltage level conversion circuit 100h according to the eighth embodiment is provided with, like the voltage level conversion circuit 100g according to the seventh embodiment, a latch circuit 110, first and second signal generation circuits C51 and C52, first and second boost circuits C61 and C62, and N channel MOS transistors Qhn3 and Qhn4 for discharging latch nodes N10 and N11.

The voltage level conversion circuit 100h further includes a pulse signal generation circuit C41 for generating a one-shot pulse signal when the circuit 100h is powered on; and an exclusive OR circuit C33 for calculating an exclusive OR of the pulse signal outputted from the pulse signal generation circuit C41 and the input signal IN1, and outputs the calculated exclusive OR signal to the first signal generation circuit C51 and to the NOT circuit C1. The pulse generation circuit C41 is a VDD1 system circuit.

Next, the operation will be described.

The voltage level conversion circuit 100h according to the eighth embodiment is different from the voltage level conversion circuit 100g according to the seventh embodiment only in that the circuit 100h operates so as to match the logical level of the input signal to the logical level of the output signal when it is powered on.

To be specific, when the voltage level conversion circuit 100h according to the eighth embodiment is powered on, the pulse signal generation circuit C41 generates a one-shot pulse signal, and the exclusive OR circuit C33 operates an exclusive OR of the one-shot pulse signal and the input signal, and outputs the operation result.

For example, when the logical level of the input signal is L level at power-on, the logical level of the output signal of the exclusive OR circuit C33 temporarily changes from L level to H level, and thereafter, returns to L level. Therefore, immediately after power-on, the first and second pulse signal generation circuits C51 and C52 successively operate, and the latch circuit 110 sets the voltage level of the output terminal Tout to H level, and thereafter, inverts it to L level. Accordingly, when the input signal of the voltage level conversion circuit is L level at power-on, the output signal of the voltage level conversion circuit surely becomes L level.

On the other hand, when the logical level of the input signal is H level at power-on, the logical level of the output signal of the exclusive OR circuit C33 temporarily changes from H level to L level, and thereafter, returns to H level. Therefore, immediately after power-on, the second and first pulse signal generation circuits C52 and C51 successively operate, and the latch circuit 110 sets the voltage level of the output terminal Tout to L level, and thereafter, inverts it to H level. Accordingly, when the input signal of the voltage level conversion circuit is H level at power-on, the output signal of the voltage level conversion circuit surely becomes H level.

As described above, the voltage level conversion circuit 100h according to the eighth embodiment is provided with the pulse signal generation circuit C41 for generating a one-shot pulse signal when the circuit 100h is powered on, in addition to the circuits and transistors constituting the voltage level conversion circuit 100g of the seventh embodiment, and an exclusive OR of the one-shot pulse signal and the input signal is output to the first and second pulse signal generation circuits C51 and C52. Therefore, when the circuit 100h is powered on, the logical level of the latch output of the latch circuit 110 changes from the logical level reverse to the logical level of the input signal to the logical level equal to the logical level of the input signal to be reset to the logic corresponding to the input signal. Thereby, immediately after power-on, the logical level of the output signal of the voltage level conversion circuit can be matched to the logical level of the input signal of the voltage level conversion circuit. Accordingly, the voltage level conversion circuit 100h of this eighth embodiment is also usable as a circuit for changing the voltage level of a DC-like signal from a low voltage system level to a high voltage system level.

While in this eighth embodiment one voltage level conversion circuit includes one pulse signal generation circuit C41 which generates a one-shot pulse signal at power-on, the pulse signal generation circuit C41 which generates a one-shot pulse signal at power-on may be shared by plural voltage level conversion circuits. In this case, the pulse signal generation circuit C41 generates a one-shot pulse signal at power-on, the one-shot pulse signal is input to the plural voltage level conversion circuits, the exclusive OR circuit in each voltage level conversion circuit performs logical operation between the input signal and the one-shot pulse signal, and the logical level of the output signal is matched to the logical level of the input signal at power-on in each voltage level conversion circuit.

While in the above-mentioned embodiments a latch circuit comprising two P channel MOS transistors and two N channel MOS transistors or a latch circuit comprising four P channel MOS transistors and two N channel MOS transistors has been described, the specific circuit construction of the latch circuit is not restricted thereto.

For example, when the on/off state of the N channel MOS transistor Qhn1 constituting the latch circuit of the first embodiment is equal to the on/off states of the N channel MOS transistors Qln1 and Qhn3 for discharging the latch node N10 and, further, the on/off state of the N channel MOS transistor Qhn2 constituting the latch circuit is equal to the on/off states of the N channel MOS transistors Qln2 and Qhn4 for discharging the latch node N11, the N channel MOS transistors Qhn1 and Qhn2 in this latch circuit can be dispensed with, thereby simplifying the construction of the latch circuit.

Furthermore, the present invention is not restricted to the above-mentioned first to eighth embodiments, and the features of the voltage level conversion circuits of the above-mentioned embodiments may be combined.

For example, the voltage level conversion circuits according to the fourth to sixth embodiments may have the latch circuit 120 according to the third embodiment instead of the latch circuit 110.

APPLICABILITY IN INDUSTRY

The voltage level conversion circuit according to the present invention is able to convert the logical voltage of an input signal from a logical voltage corresponding to a lower internal voltage to a logical voltage corresponding to an external voltage as a high power supply voltage, and therefore, it is useful in a semiconductor device which is required to perform a low voltage operation with a lower internal voltage.

What is claimed is:

1. A voltage level conversion circuit for converting an input signal having a logical voltage corresponding to a first power supply voltage into an output signal having a logical voltage corresponding to a second power supply voltage that is higher than the first power supply voltage, and outputting the output signal, said voltage level conversion circuit comprising:
    a latch circuit comprising plural MOS transistors each having the second power supply voltage as a breakdown voltage, and operable to latch a non-inversion logic corresponding to the input signal at a first latch node while latching an inversion logic reverse to the input signal at a second latch node;
    a first N channel MOS transistor having the second power supply voltage as a breakdown voltage, which is connected between the first latch node and a ground voltage supply;
    a second N channel MOS transistor having the second power supply voltage as a breakdown voltage, which is connected between the second latch node and the ground voltage supply; and
    a transistor driving circuit having the first power supply voltage as a power supply voltage, and operable to apply, when the input signal transits, a pulse signal having a pulse height that is boosted to a level higher than the first power supply voltage, to a gate of the first N channel MOS transistor or to a gate of the second N channel MOS transistor;
    a third N channel MOS transistor having the first power supply voltage as a breakdown voltage, which is connected in series to the first N channel MOS transistor, between the first latch node and the ground voltage supply; and
    a fourth N channel MOS transistor having the first power supply voltage as a breakdown voltage, which is connected in series to the second N channel MOS transistor, between the second latch node and the ground voltage supply.

2. A voltage level conversion circuit as defined in claim 1 wherein
    when the input signal transits, said transistor driving circuit is operable to drive both of the first and third N channel MOS transistors or to drive both of the second and fourth N channel MOS transistors using the pulse signal.

3. A voltage level conversion circuit as defined in claim 1 wherein
    said transistor driving circuit maintains the off states of the first to fourth N channel MOS transistor so that the output signal is not reset to the logic corresponding to the input signal, when the voltage level conversion circuit is powered on.

4. A voltage level conversion circuit as defined in claim 1 wherein
    said transistor driving circuit drives the first to fourth N channel MOS transistors so that the output signal is reset to the logical voltage corresponding to the input signal, when the voltage level conversion circuit is powered on.

5. A voltage level conversion circuit as defined in claim 1 wherein
    when the input signal transits, said transistor driving circuit is operable to apply a pulse signal whose pulse height is boosted to a level higher than the first power supply voltage to the gate of the first N channel MOS transistor or to the gate of the second N channel MOS transistor, and to apply a logical signal according to the input signal or an inversion signal of the input signal to the gate of the third N channel MOS transistor or to the gate of the fourth N channel MOS transistor.

6. A voltage level conversion circuit as defined in claim 4 wherein
    said transistor driving circuit maintains the off states of the first to fourth N channel MOS transistors so that the output signal is not reset to the logical voltage corresponding to the input signal, when the voltage level conversion circuit is powered on.

7. A voltage level conversion circuit as defined in claim 4 wherein
    said transistor driving circuit drives the first to fourth N channel MOS transistors so that the output signal is reset to the logical voltage corresponding to the input signal, when the voltage level conversion circuit is powered on.

8. A voltage level conversion circuit for converting an input signal having a logical voltage corresponding to a first power supply voltage into an output signal having a logical voltage corresponding to a second power supply voltage that is higher than the first power supply voltage, and outputting the output signal said voltage level conversion circuit comprising:
    a latch circuit comprising plural MOS transistors each having the second power supply voltage as a breakdown voltage, and operable to latch a non-inversion logic corresponding to the input signal at a first latch node while latching an inversion logic reverse to the input signal at a second latch node;
    a first N channel MOS transistor having the second power supply voltage as a breakdown voltage, which is connected between the first latch node and a ground voltage supply;
    a second N channel MOS transistor having the second power supply voltage as a breakdown voltage, which is connected between the second latch node and the ground voltage supply; and
    a transistor driving circuit having the first power supply voltage as a power supply voltage, and operable to apply, when the input signal transits, a pulse signal having a pulse height that is boosted to a level higher than the first power supply voltage, to a gate of the first N channel MOS transistor or to a gate of the second N channel MOS transistor;

wherein, when the input signal transits, a pulse signal whose pulse height varies from the ground voltage to a boosted voltage higher than the first power supply voltage is applied to the gate of the first N channel MOS transistor or to the gate of the second N channel MOS transistor.

9. A voltage level conversion circuit as defined in claim 7 wherein said transistor driving circuit maintains the off states of the first and second N channel MOS transistors so that the output signal is not reset to the logical voltage corresponding to the input signal, when the voltage level conversion circuit is powered on.

10. A voltage level conversion circuit as defined in claim 7 wherein said transistor driving circuit drives the first and second N channel MOS transistors so that the output signal is reset to the logical voltage corresponding to the input signal, when the voltage level conversion circuit is powered on.

11. A voltage level conversion circuit for converting an input signal having a logical voltage corresponding to a first power supply voltage into an output signal having a logical voltage corresponding to a second power supply voltage that is higher than the first power supply voltage, and outputting the output signal, said voltage level conversion circuit comprising:

a latch circuit comprising plural MOS transistors each having the second power supply voltage as a breakdown voltage, and operable to latch a non-inversion logic corresponding to the input signal at a first latch node while latching an inversion logic reverse to the input signal at a second latch node;

a first N channel MOS transistor having the second power supply voltage as a breakdown voltage, which is connected between the first latch node and a ground voltage supply;

a second N channel MOS transistor having the second power supply voltage as a breakdown voltage, which is connected between the second latch node and the ground voltage supply; and a transistor driving circuit having the first power supply voltage as a power supply voltage, and operable to apply, when the input signal transits, a pulse signal having a pulse height that is boosted to a level higher than the first power supply voltage, to a gate of the first N channel MOS transistor or to a gate of the second N channel MOS transistor;

said latch circuit comprising:

a first series circuit comprising a P channel MOS transistor having the second power supply voltage as a breakdown voltage and an N channel MOS transistor having the second power supply voltage as a breakdown voltage, which are connected in series between the second power supply and the ground voltage supply; and a second series circuit comprising a P channel MOS transistor having the second power supply voltage as a breakdown voltage and an N channel MOS transistor having the second power supply voltage as a breakdown voltage, which are connected in series between the second power supply and the ground voltage supply;

wherein the first latch node is a connection point of the power supply side P channel MOS transistor and the ground side N channel MOS transistor in the first series circuit which is connected to gates of the P channel MOS transistor and the N channel MOS transistor in the second series circuit; and wherein the second latch node is a connection point of the power supply side P channel MOS transistor and the ground side N channel MOS transistor in the second series circuit which is connected to gates of the P channel MOS transistor and the N channel MOS transistor in the first series circuit.

12. A voltage level conversion circuit for converting an input signal having a logical voltage corresponding to a first power supply voltage into an output signal having a logical voltage corresponding to a second power supply voltage that is higher than the first power supply voltage, and outputting the output signal, said voltage level conversion circuit comprising:

a latch circuit comprising plural MOS transistors each having the second power supply voltage as a breakdown voltage, and operable to latch a non-inversion logic corresponding to the input signal at a first latch node while latching an inversion logic reverse to the input signal at a second latch node;

a first N channel MOS transistor having the second power supply voltage as a breakdown voltage, which is connected between the first latch node and a ground voltage supply;

a second N channel MOS transistor having the second power supply voltage as a breakdown voltage which is connected between the second latch node and the ground voltage supply; and a transistor driving circuit having the first power supply voltage as a power supply voltage, and operable to apply, when the input signal transits, a pulse signal having a pulse height that is boosted to a level higher than the first power supply voltage, to a gate of the first N channel MOS transistor or to a gate of the second N channel MOS transistor;

said latch circuit comprising:

a first series circuit comprising two P channel MOS transistors having the second power supply voltage as a breakdown voltage, which are connected in series between the second power supply and the first latch node, and an N channel MOS transistor having the second power supply voltage as a breakdown voltage, which is connected between the first latch node and the ground voltage supply; and a second series circuit comprising two P channel MOS transistors having the second power supply voltage as a breakdown voltage, which are connected in series between the second power supply and the second latch node, and an N channel MOS transistor having the second power supply voltage as a breakdown voltage, which is connected between the second latch node and the ground voltage supply;

wherein:

a gate of the power supply side P channel MOS transistor in the first series circuit and a gate of the N channel MOS transistor in the first series circuit are connected to the second latch node;

a gate of the power supply side P channel MOS transistor in the second series circuit and a gate of the N channel MOS transistor in the second series circuit are connected to the first latch node; and a pulse signal which is generated in the transistor driving circuit when the input signal transits is applied to gates of the latch node side P channel MOS transistors in the first and second series circuits.

13. A voltage level conversion circuit for converting an input signal having a logical voltage corresponding to a first power supply voltage into an output signal having a logical voltage corresponding to a second power supply voltage that is higher than the first power supply voltage, and outputting the output signal, said voltage level conversion circuit comprising:
- a latch circuit comprising plural MOS transistors each having the second power supply voltage as a breakdown voltage, and operable to latch a non-inversion logic corresponding to the input signal at a first latch node while latching an inversion logic reverse to the input signal at a second latch node;
- a first N channel MOS transistor having the second power supply voltage as a breakdown voltage, which is connected between the first latch node and a ground voltage supply;
- a second N channel MOS transistor having the second power supply voltage as a breakdown voltage, which is connected between the second latch node and the ground voltage supply; and
- a transistor driving circuit having the first power supply voltage as a power supply voltage, and operable to apply, when the input signal transits, a pulse signal having a pulse height that is boosted to a level higher than the first power supply voltage, to a gate of the first N channel MOS transistor or to a gate of the second N channel MOS transistor;

said latch circuit comprising:
- a first P channel MOS transistor having the second power supply voltage as a breakdown voltage, which is connected between the second power supply and the first latch node; and
- a second P channel MOS transistor having the second power supply voltage as a breakdown voltage, which is connected between the second power supply and the second latch node;

wherein a gate of the first P channel MOS transistor is the second latch node, and a gate of the second P channel MOS transistor is the first latch node.

* * * * *